(12) United States Patent
Steinbrueck et al.

(10) Patent No.: US 8,872,297 B2
(45) Date of Patent: Oct. 28, 2014

(54) INTEGRATED PHOTODIODE FOR SEMICONDUCTOR SUBSTRATES

(71) Applicant: Tau-Metrix, Inc., Santa Clara, CA (US)

(72) Inventors: Gary Steinbrueck, Wappingers, NY (US); James S. Vickers, San Jose, CA (US); Mario M. Pelella, Mountain View, CA (US); Majid Aghababazadeh, Cupertino, CA (US); Nadar Pakdaman, Los Gatos, CA (US)

(73) Assignee: Tau-Metrix, Inc., Santa Clara, CA (US)

( * ) Notice: Subject to any disclaimer, the term of this patent is extended or adjusted under 35 U.S.C. 154(b) by 0 days.

(21) Appl. No.: 13/781,437

(22) Filed: Feb. 28, 2013

(65) Prior Publication Data

US 2013/0334644 A1 Dec. 19, 2013

Related U.S. Application Data

(62) Division of application No. 12/547,463, filed on Aug. 25, 2009, now Pat. No. 8,410,568.

(60) Provisional application No. 61/093,292, filed on Aug. 29, 2008.

(51) Int. Cl.
*H01L 31/0203* (2014.01)
*H01L 27/144* (2006.01)
*H01L 27/146* (2006.01)

(52) U.S. Cl.
CPC ...... *H01L 27/1443* (2013.01); *H01L 27/14603* (2013.01); *H01L 27/14689* (2013.01)
USPC ............ 257/434; 257/432; 438/678; 438/754

(58) Field of Classification Search
None
See application file for complete search history.

(56) References Cited

U.S. PATENT DOCUMENTS

| 6,281,428 B1 | 8/2001 | Chiu et al. |
| 2003/0015705 A1 | 1/2003 | Chason et al. |

(Continued)

FOREIGN PATENT DOCUMENTS

| JP | S55-026661 | 7/1980 |
| JP | 2001-077400 | 3/2001 |

(Continued)

OTHER PUBLICATIONS

Notification of Transmittal of International Search Report and The Written Opinion of the International Searching Authority mailed Feb. 26, 2010, for related PCT Application No. PCT/US2009/055408 filed Aug. 28, 2009, 13 pages.

(Continued)

*Primary Examiner* — Kyoung Lee
(74) *Attorney, Agent, or Firm* — Mahamedi Paradice LLP

(57) ABSTRACT

A substrate section that is at least partially fabricated to include contact elements and materials. The substrate section includes doped regions that have a heavily doped N-type region and a heavily doped P-type region adjacent to one another. An exterior surface of the substrate has a topography that includes a light-transparent region in which light, from a light source, is able to reach a surface of the substrate. An application of light onto the light transparent region is sufficient to cause a voltage potential to form across a junction of the heavily doped regions. The substrate section may further comprise one or more electrical contacts, positioned on the substrate section to conduct current, resulting from the voltage potential created with application of light onto the light transparent region, to a circuit on the semiconductor substrate.

29 Claims, 18 Drawing Sheets

(56) References Cited

U.S. PATENT DOCUMENTS

| | | |
|---|---|---|
| 2003/0071646 A1 | 4/2003 | Neo et al. |
| 2005/0253132 A1* | 11/2005 | Marshall et al. ............ 257/24 |
| 2008/0078444 A1 | 4/2008 | Atanackovic |

FOREIGN PATENT DOCUMENTS

| | | |
|---|---|---|
| JP | 2001-085731 | 3/2001 |
| JP | 2001-135849 | 5/2001 |
| JP | S51-81586 | 9/2007 |
| KR | 10-2004-57238 A | 7/2004 |
| KR | 10-2008-74938 A | 8/2008 |
| TW | 2005-0024172 | 7/2005 |
| WO | WO-2010-025391 A2 | 3/2010 |

OTHER PUBLICATIONS

Office Action mailed Sep. 5, 2013, for related Taiwan Application No. 098129125, 10 pages.

Office Action mailed Oct. 1, 2013, for related Japanese Application No. 2011-525243.

Office Action mailed Sep. 17, 2013, for related Japanese Application No. 2011-264468.

Office Action mailed Nov. 22, 2013, for related Taiwanese Application No. 098729125.

* cited by examiner

Layout

Cross-section

Layout

Cross-section

INTEGRATED PHOTODIODE FOR SEMICONDUCTOR SUBSTRATES

This application is a Divisional of U.S. patent application Ser. No. 12/547,463, filed Aug. 25, 2009, which claims benefit of priority to Provisional U.S. Patent Application No. 61/093,292, filed Aug. 29, 2008; all of the aforementioned priority applications are hereby incorporated by reference in their entirety for all purposes.

BACKGROUND

The conversion of light energy into electrical energy using semiconducting devices has traditionally been performed either with a photovoltaic device or a photoconductive device. Although the physical process for current generation in both devices is the same, photovoltaic devices generally refer to the process of generating useful electrical power from an optical input, for example in a solar panel that converts sunlight into electrical power, while photoconductive devices are used to detect optical signals, for example in a photodetector that converts an optical signal into an electrical signal. Both types of devices require optical photons of sufficient energy to generate an electron-hole pair within the semiconductor, where electrons can be captured by an N-type region in the semiconductor, and holes by a corresponding P-type region. The operational difference between a photovoltaic device and a photoconductive device concerns whether an external reverse bias is applied to the device, or not. For example, in a photovoltaic device, the photogenerated electron and hole are naturally separated by the space-charge region with its built-in electrical field that exists between the N- and P-doped regions, whereas in a photoconductive device, the semiconductor is typically negatively biased, and the photogenerated electron and hole are separated by the electric field of the applied reverse bias. As a result, photovoltaic devices can generate a useful current and a voltage when illuminated, thereby generating electrical power, while a photoconductor device generates a photocurrent, but consumes power in the process since the device is negatively biased by an outside potential.

Any semiconductor material can be made into either a photovoltaic or a photoconductive device. However, some semiconductor materials are better suited to this process than are others. One large division of semiconductors involves whether they have a direct or an indirect energy bandgap. Direct-gap semiconductors convert optical energy into electrical energy more efficiently than do indirect-gap semiconductors. An example of an indirect-gap semiconductor is silicon, a group-IV element, which for practical reasons having to do with manufacturing ease and robustness has become the de-facto semiconductor on which almost all modern integrated circuits are based. An example of a direct bandgap semiconductor is any III-V compound such as GaAs, in which a group-III element (Ga) is combined with an identical number of a group V element (As). Such III-V devices are greatly preferable to silicon for their optoelectronic properties.

The field of optical communications requires the integration of a photodetector with processing electronics. Currently high-performance devices, such as telecommunications transceiver systems, integrate a III-V photodetector (or photoemitter) with silicon processing electronics. However, for purely practical reasons, it is desirable to combine both the photodetector and the integrated electronic circuitry within the same semiconducting substrate, which requires that the photodetector be built using the same manufacturing steps available to the silicon processing electronics such as bulk silicon and Silicon-on-insulator (SOI) processes amongst others. Much research has been centered on designing the best silicon photoreceiver possible given the manufacturing constraints imposed by mass wafer production techniques. Furthermore, this branch of optoelectronics is often centered on reverse-biased photoconductive devices since these devices have a faster optical response time as compared with unbiased photovoltaic detectors. There is far less comparative research on the use of photovoltaic detectors to generate power on standard silicon processing electronics. Most of the research on photovoltaic devices centers on improving standalone photovoltaic cells for solar panel applications, for instance by improving their conversion efficiency or by finding new ways to make standard photovoltaic cells more inexpensive, and not with combining such devices together with other integrated electronic circuits.

DETAILED DESCRIPTION

Figure 1A:
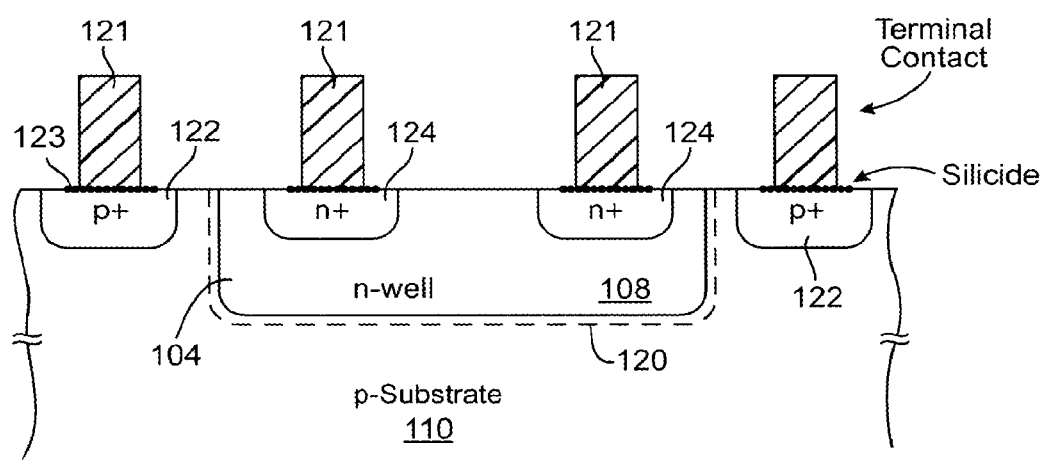
FIG. 1A is a side cross-sectional view of a substrate device with an integrated photodiode formation for powering circuits and devices, such as test structures and devices under test, under one or more embodiments.

Numerous embodiments are described herein relating to design and construction of photovoltaic diodes optimized for power, efficiency, and stability that accommodate standard silicon manufacturing and design practices, constraints and considerations for integrated circuit fabrication. Such standard silicon manufacturing may include amongst others, bulk silicon and SOI processes and design. According to one or more embodiments, a photovoltaic device is to be used for converting power from an optical source, using the power thus generated to run an electrical circuit and test structure, and fabricated for doing so within the device design manufacturing constraints defined for the original purpose of the silicon wafer.

Still further, some embodiments provide for a photodiode that includes properties and qualities that accommodate the constraints of the manufacturing process. One or more embodiments include photodiodes that are constructed to center around building an optimal or improved photovoltaic device that is subject to the constraints of the design and manufacturing process. Specifically, embodiments described herein include photovoltaic photodiodes that are constructed to operate within the design and process constraints and optimized for selected applications. Applications for use with one or more embodiments include design and manufacturing analysis, control of wafer fabrication and design processes, circuit performance, integration of process with design, and device process and design characterization.

One or more embodiments provide for: (i) efficiently activating test structures (with consideration for saturation or physical damage of the photovoltaic device) disposed or otherwise integrated in a wafer (in both fabricated and partially fabricated state), (ii) matching the electrical characteristics (i.e. impedance matching) of the photovoltaic devices to those of integrated circuits and devices that the photovoltaic devices electrically activate, (iii) creating electrical and optical isolation of the photovoltaic devices from neighboring circuits and devices, (iv) sizing the dimensions of the photovoltaic devices to meet requirements and constraints for a particular use, and/or (v) implementing design and processing to provide optical access for the photovoltaic devices.

Some embodiments described herein provide for a substrate section that is at least partially fabricated to include contact elements and materials. The substrate section includes doped regions that have a heavily doped N-type region and a heavily doped P-type region adjacent to one another. An exterior surface of the substrate has a topography that includes a light-transparent region in which light, from a light source, is able to reach a surface of the substrate. An application of light onto the light transparent region is sufficient to cause a voltage potential to form across a junction of the heavily doped regions. The substrate section may further comprise one or more electrical contacts, positioned on the substrate section to conduct current, resulting from the voltage potential created with application of light onto the light transparent region, to a circuit on the semiconductor substrate.

Numerous embodiments described herein provide for a junction formed by different types of doped semiconductor regions. In particular, embodiments provide for the formation of a photodiode using "P" and "N" type regions, including heavily doped P and N regions. A P-type doped region of a semiconductor substrate corresponds to a region in which the majority of carriers correspond to holes. Similarly, a N-type doped region of a semiconductor substrate corresponds to a region in which the majority of carriers are electrons.

Furthermore, embodiments described herein provide for formation of a photodiode using heavily (or highly) doped regions of a substrate. A heavily doped region implies that the region has more dopant than an adjacent, but similarly doped region. More specifically, a heavily doped region can be assumed to have at least $1E18$ atoms/cm$^3$ of dopant.

As used herein, the term "opaque" or "light transparent" is relative to the wavelength of light being used. In general, embodiments assume use of lasers as the source of light, and more particularly, visible light lasers. Thus, "opaque" and "light transparent" in such content apply to visible light, and opaque material may be provided by silicide or similar materials. Such materials may not, however, be opaque to more narrow wavelengths of light.

FIG. 1A is a side cross-sectional view of a substrate device with an integrated photodiode formation for powering circuits and devices, such as test structures and devices under test, under one or more embodiments. As described by numerous embodiments, the photodiode formation may correspond to a photovoltaic PN junction. In an embodiment of FIG. 1A, the substrate device 110 includes an N-well 108 provided within a P-type substrate. As described, the P-type substrate 110 is characterized by a topography that includes a light transparent region for enabling a photodiode to generate power on the substrate. The P-substrate 110 is representative of a portion of a doped semiconductor wafer prior to circuit manufacturing and associated processing having occurred. In one embodiment, shallow N-type regions 124 are formed in the N-well 108, and shallow P-type regions 122 are formed in the P-substrate outside of the N-well. Metal contacts 121 are formed on each of the heavily doped P-type and N-type regions 122, 124 respectively. The metal contacts 121 may be formed over material silicide 123, such as to form an opaque layer. The lateral span of each of the P-type and N-type regions 122, 124 may be dimensioned to exceed the lateral span of the silicide 123. As described, this allows, for example, the heavily doped P-type and N-type regions 122, 124 to receive light directed onto a coincidental light transparent region 125 formed on a surface of the substrate device 110. In general, the light-transparent region 125 is formed by designating an area on the surface of the substrate to be non-occluded with opaque materials, such as silicide, metal contacts are the like. For example, under one implementation, the light transparent region 125 is formed by shaping contact elements 121 and/or eliminating (or preventing deposit of), removing silicide 123 from between contact elements 121.

As shown, light-transparent region 125 is formed on an exterior of the substrate 110 to overlay a portion of the region where a photovoltaic PN junction 120 is formed. For example, the contact elements 121 may be selectively deposited and formed so as to be shaped and dimensioned to enable an exposed region (corresponding to the light-transparent region 125) to form over the N-well 108. When subjected to a suitable laser, the light-transparent region 125 enables sufficient light to pass through to (in an embodiment of FIG. 1) the P-substrate 110 and the heavily doped P-type region 122 to cause electron hole pairs generation. A photovoltaic junction effect, as described below, is triggered (i.e. creation of the photovoltaic PN junction 120) from which current is generated and extended via one or more of the electrical contacts 121 to a circuit or device (e.g. test structure, device under test).

The photovoltaic junction effect generally corresponds to electron hole generation and travel (whether by diffusion or otherwise). In some embodiments, the photovoltaic junction effect corresponds to the following. If the incident light is fully absorbed, then electrons and holes diffuse within the N-type regions until the holes encounter the built-in electric field in the depletion (space-charge) region. At this point the holes cross into the substrate, while the electrons remain trapped in the N-type regions. This is a process that builds up a negative potential in the N-type region (due to the accumulation there of electrons) and a positive potential in an adjacent P-type region (due to the accumulation there of holes). Such a structure enables a photo-diode for many types of application.

One problem that can be encountered with the photovoltaic junction effect of the configuration shown is that the N-type regions (e.g. the heavily doped N-type regions 124 and the N-well 108), which are implanted (or diffused) into the P-type substrate 110 for typical silicon manufacturing, are usually much shallower than the optical absorption depth of the incident light, meaning that only a fraction of the incident optical power is absorbed within the N-type region, while the rest is absorbed in the P-type substrate 110. In the example shown, electron-hole pairs are created in both N-type and P-type regions. As before, electrons within the N-type region will be trapped, while the holes will escape to the P-type substrate. Similarly, holes generated in the P-type substrate will be trapped in the substrate, but the electrons will diffuse until (i) they either drift near a PN junction and are swept into the N-type region by the electric field of the depletion region, or (ii) they recombine with a hole in the substrate. The electrons in the substrate 110 can diffuse quite a long way (relative to the dimensions described for the substrate), and therefore may not be collected by the N-type region of the photovoltaic PN junction 120. For instance, if there are multiple heavily doped N-type regions 124 implanted into a P-type substrate 110, but optical power only illuminates one region, the stray electrons created in the P-type substrate due to the optical power may be collected in any of the N-type regions. Thus, for example, the act of illuminating a single N-type region (such as the heavily doped N-type region 124) with optical power may result in the negative charging of all N-type regions on the same substrate. Such an occurrence may have negative consequences. For example, this stray carrier charging of the non photovoltaic regions and devices could potentially impact and change the electrical response and characteristics of the devices and circuits that are under test during a product or test wafer fabrication process.

Accordingly, embodiments recognize that many applications may require measures to be taken to isolate, when the photovoltaic junction effect occurs, the generation of the photo-induced carriers from the non-photovoltaic structures and devices. One or more embodiments described herein isolate photovoltaic detectors and devices from one another such that the issue of cross-talk and unwanted charging are eliminated or mitigated.

Figure 1B:
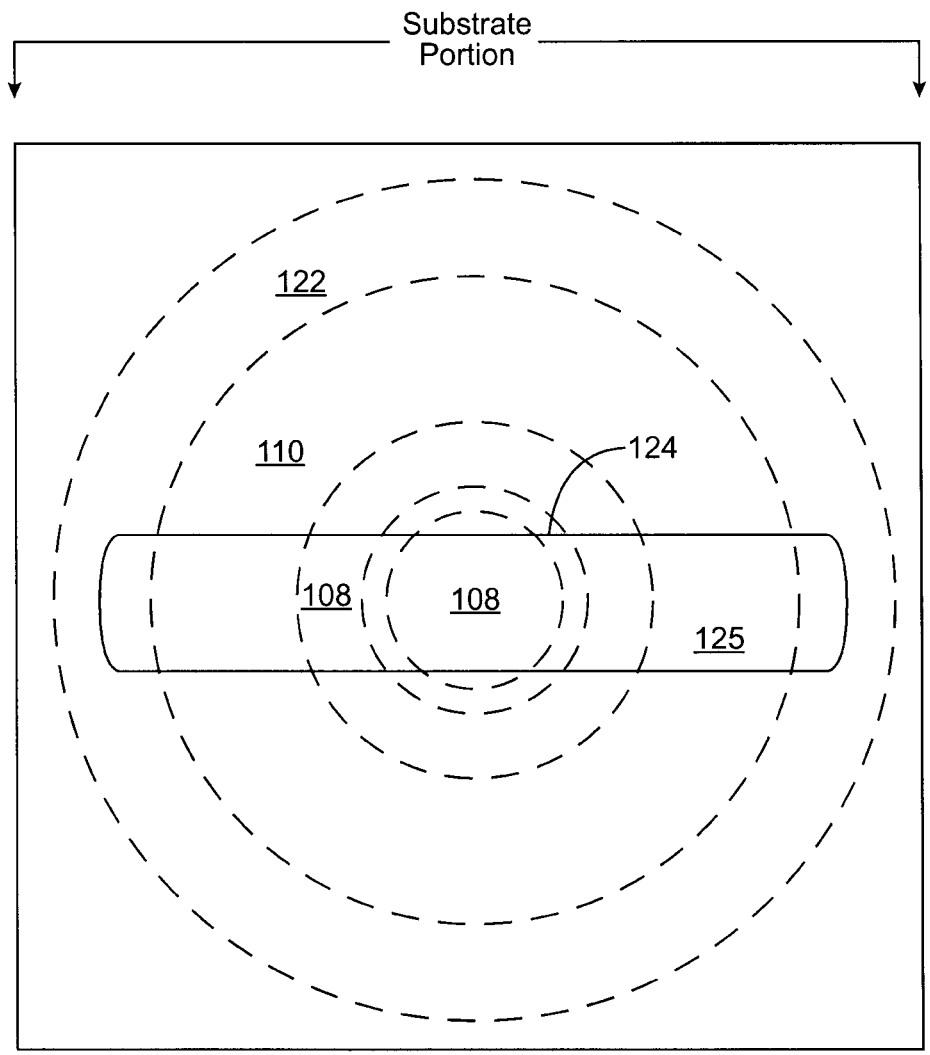
FIG. 1B is a top view of the region depicted in FIG. 1A.

FIG. 1B is a top view of the region depicted in FIG. 1A. Power generated from the transparency (from light) may be carried to circuit elements, such as test structures (e.g. ring oscillators) via the contact elements 112. As shown, the combination of metal contacts 121 are formed over doped regions that may extend on a substrate portion 140 in any one of many possible configurations. The substrate portion 140 may correspond to, for example, a portion of an active part of a semiconductor wafer. In FIG. 1B, for example, the doped regions are concentric and rectangular-shaped and have metal contacts formed thereon. Power generated from application of light onto the substrate (at the light transparent region) is carried to circuit elements, such as test structures (e.g. ring oscillators) via the contact elements 121.

In configurations such as depicted, the light transparent region 125 is integrated so as to form an ultra-small footprint on the substrate 110. In one embodiment, dimensions of the light transparent region 125 are of the order of 10×20 microns, although dimensions of orders greater and less than that stated are possible. For example, the dimensions of the light transparent region 125 may be less than 100×100 microns. The size of the light transparent region 125 may be limited by function and the power needs of the substrate's circuit elements. The smaller the area of the light transparent region 125, the less power is capable of being generated.

For the various sectional views displayed, different implementations may utilize different layouts. For example, the layouts of structures that comprise or correspond to the photodiodes may correspond to concentric polygon or box ring layouts. Alternatively, a "donut configuration" may be implemented for the layout. In some applications, the donut configuration provides lower electrical resistance of the photodiode formed by the junctions.

Figure 1C:
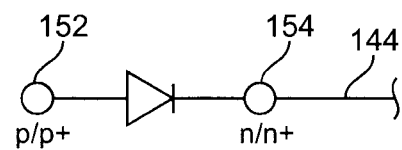
FIG. 1C is a circuit schematic representation of an integrated photodiode such as shown and described with an embodiment of FIG. 1A.

FIG. 1C is a circuit schematic representation of an integrated photodiode such as shown and described with an embodiment of FIG. 1A. For an embodiment such as depicted by FIG. 1A, the photodiode 150 includes terminals 152, 154 corresponding to respective P and N doped regions, matching a direction of current flow. One or more leads 144 (which may correspond to the electrical contacts extended from the N-region) may extend or be in contact with the photodiode 150 to extend power to, for example, test circuits and devices under test.

Figure 2A:
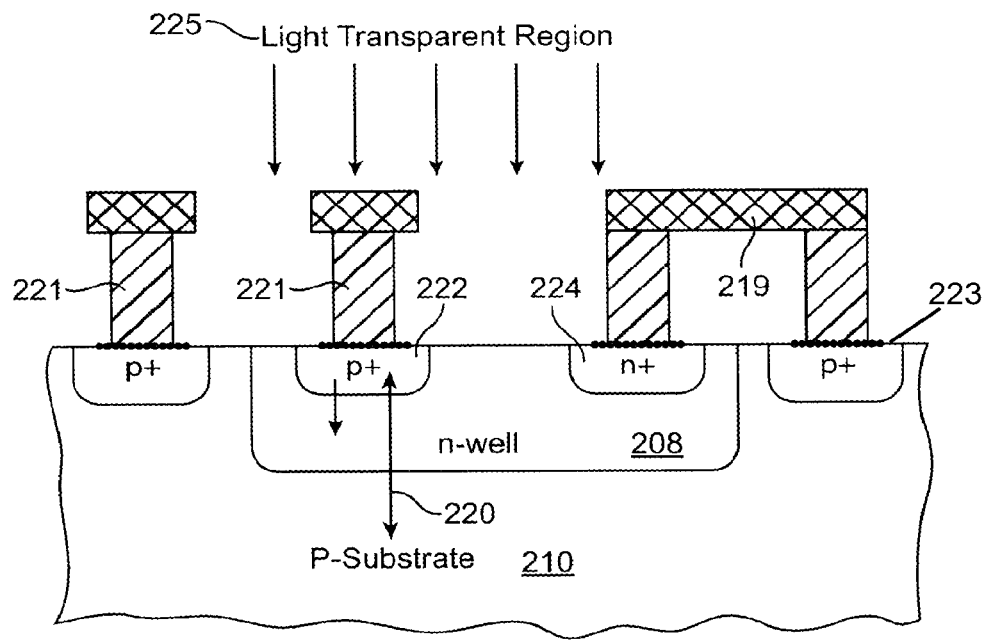
FIG. 2A is a side cross-sectional view of a substrate device with an integrated photodiode formation, according to another embodiment.

FIG. 2A is a side cross-sectional view of a substrate device with an integrated photodiode formation, according to another embodiment. In an embodiment of FIG. 2A, an N-type region 208 (or N-well) is formed within a P-substrate 210. The P-type region 222 and N-type regions 224 are provided in regions contained within the N-well, and at the surface of the substrate so as to be affected by light directed on the substrate. A light transparent region 225 coincides with non-obstructed portions of the N-well 208, which includes portions of P-type region 222 and N-type region 224. As with previous examples, contacts 221 are provided on opaque regions of the substrate. For example, the contacts 221 may be formed on silicide 223 or other such material. In an embodiment of FIG. 2A, a photovoltaic PN junction 220 is formed between the heavily doped P-type region 222 and the N-well 208 (including the heavily doped N-region 224). Heavily doped P-type regions 229 (not contained in N-well 208) are formed on the P-substrate 210 at thicknesses that are at or near the substrate surface, so as to directly underlie contact elements 221.

In an embodiment depicted, a second PN junction 227 is formed between the N-well 208 and the P-substrate 210. The heavily-doped N-region 224 is electrically isolated by 'shorting' the region using the contact element 221 to extend electrical contact to the heavily doped P-type region 239. The presence of the short facilitates the creation of positive voltage at P-type region 222, relative to the substrate 210, with application of light on the light transparent region. This electrical contact 221 is extended to another P-type sub region 239 (outside of the N-well 208) that is formed in the p-substrate 210. The result is that the junction between the P-type sub region 222 and the N-well 208 is isolated from the substrate 210. The effects of the second PN junction 227 is then mitigated.

As with an embodiment of FIG. 1A, light-transparent region 225 is formed by precluding or eliminating opaque materials (e.g., electrical contacts and silicide) from forming in its designated region. The heavily doped P-type and N-type regions 222, 224 may be exposed in the N-well 208 and positioned to coincide with the light transparent region 225. Application of light in the light transparent region 225 results in excitation and travel of carriers, resulting in a photovoltaic junction effect, as described. More specifically, an input power may be absorbed in any of the layers—either the central P-type sub-region 222, the N-well 204, or the P-type substrate 210. Holes generated as a result in the P-type sub-region 222 are substantially contained within those regions, and electrons generated within the N-well 208 are substantially contained therein. Such containment is attributable to the electric field at the depletion (space-charge) layers where alternate regions meet. Electrons generated in the central P-type sub-region 222 are swept into the N-well 208, where a substantial amount will be contained. An embodiment such as shown provides a photovoltaic device that captures the carriers generated in the central P-type region 222, approximately half of the carriers generated in the N-well 208, and none of the carriers generated in the P-substrate 210. As such, this type of photovoltaic device is substantially insensitive to light striking the silicon wafer anywhere other than in its sensitive region (the P-type sub-region 222 within the N-well 208).

Figure 2B:
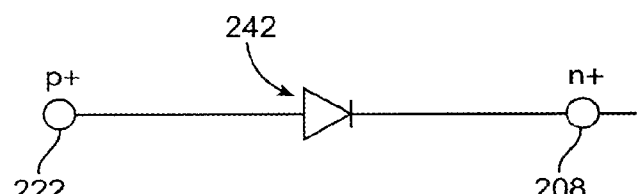
FIG. 2B is a circuit schematic diagram of a photodiode formed by a configuration shown in an embodiment of FIG. 2A.

FIG. 2B is a circuit schematic diagram of a photodiode formed by a configuration shown in an embodiment of FIG. 2A. The photodiode 242 (corresponding to PN junction 220) extends between the heavily doped P-region 222 to the N-well 208. Another photodiode 243 (corresponding to PN junction 227 between P-substrate 210 and Nwell 208) is electrically shorted by 217.

Figure 2C:
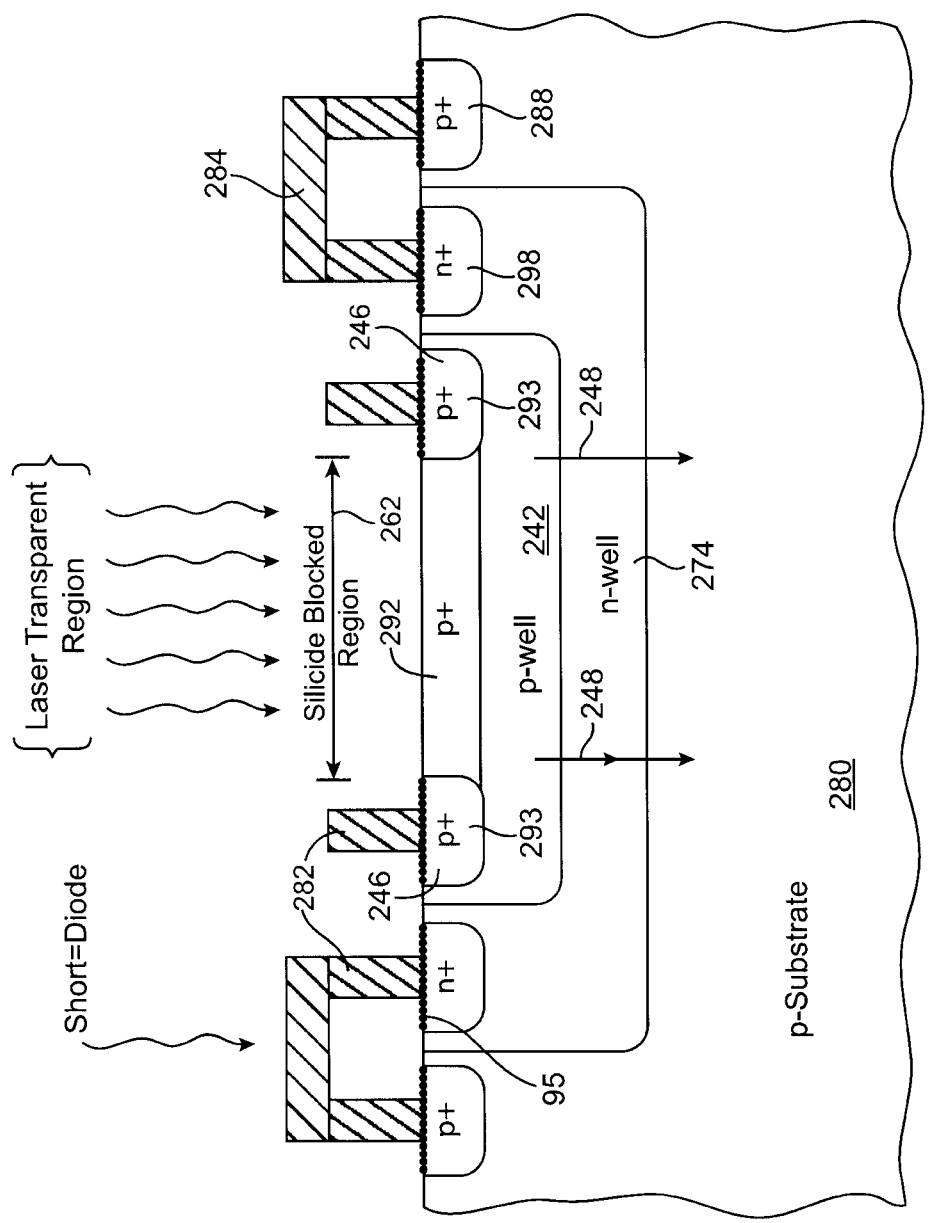
FIG. 2C illustrates a variation to an embodiment of FIG. 2A, under another embodiment.

FIG. 2C illustrates a variation to an embodiment of FIG. 2A, under another embodiment. More specifically, as with an embodiment of FIG. 2A, an N-type region 274 (n-well) is formed within a P-substrate 280. Heavily doped sub-regions are formed on the P-substrate 280, on which contact elements 282 are provided. The N-well 274 contains heavily doped sub-regions, including: (i) heavily doped P-type region 293 that underlie silicide 295 and corresponding electrical contacts 282; (ii) an extended high-doped P-type region 292 that extends between the heavily doped p-type sub-regions 293; and (iii) heavily doped N-type region 298. The presence of heavily doped P-type regions 292, 293 reduce the parasitic resistance of the photodiode formed by the PN junction of the structure of FIG. 2B.

The extended P-type sub-region 292 is provided in light transparent region 262 (e.g. silicide blocked) at shallow or surface depth so as to be at least partially accessible to light. The photodiode is formed primarily from the photovoltaic PN junction corresponding to the extended p-type sub-region 292 and the N-well 274. As with an embodiment of FIG. 2A, the photodiode is substantially isolated, in that the N-type sub-region 298 is shorted using electrical contacts 282 that extend out of the N-well 274 region. As shown by an embodiment of FIG. 2B, optical access may be limited to the surface that substantially overlays the extended P-type region 292 by implementing, for example, a masking process that blocks formation of opaque material or structures over that region. For example, in an embodiment shown, a masking process may be used to block silicide formation and create the laser transparent region 262, which overlays at least a portion of the extended P-type sub-region 292 that provides the junction for the integrated photodiode.

Figure 2E:
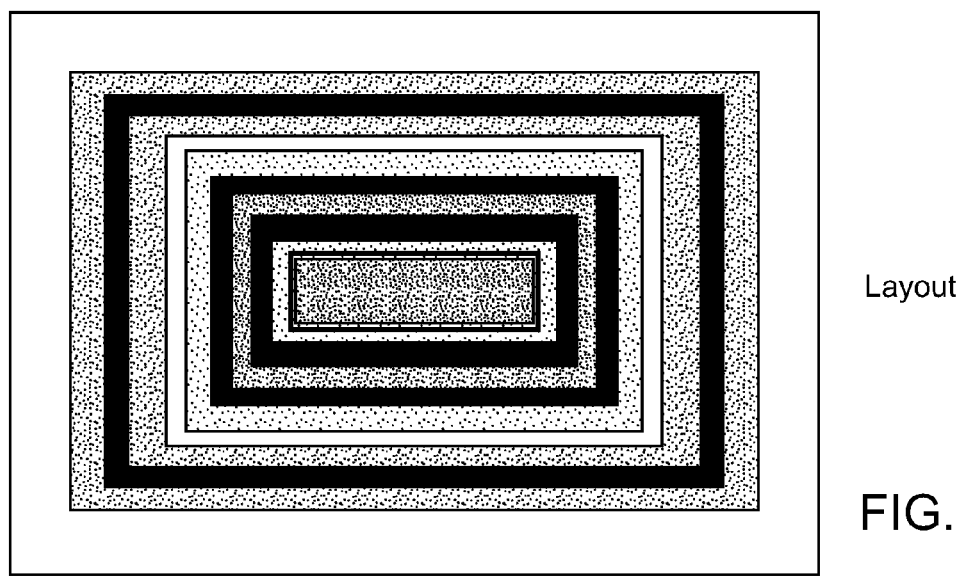
FIG. 2E illustrates a layout of FIG. 2D.
Figure 2D:
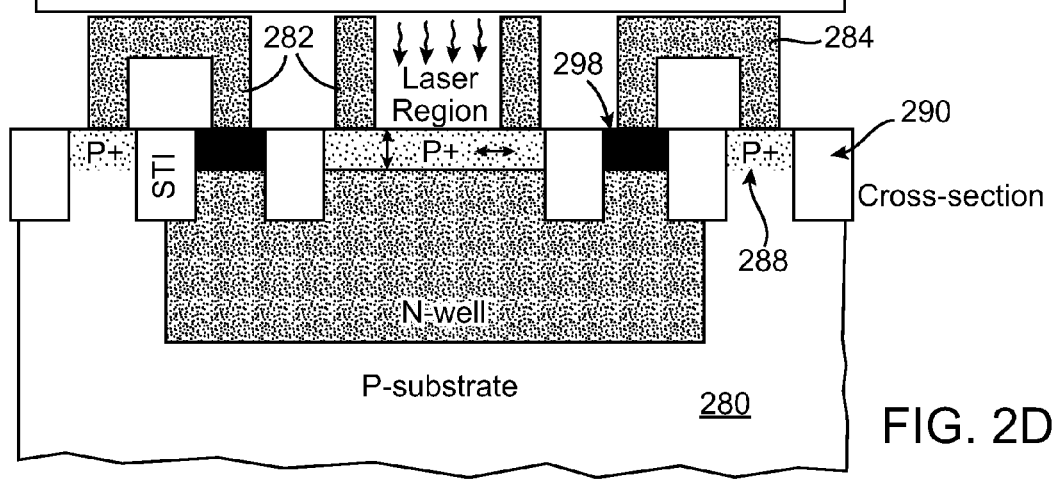
FIG. 2D illustrates a variation to an embodiment of FIG. 2C, under another embodiment.

FIG. 2D illustrates a variation to an embodiment of FIG. 2C, under another embodiment. FIG. 2E illustrates a layout of an embodiment of FIG. 2D. As with an embodiment of FIG. 2C, FIG. 2D and FIG. 2E illustrate an N-type region 274 (n-well) that is formed within a P-substrate 280 and heavily doped sub-regions are formed on the P-substrate 280, on which contact elements 282 are provided. The N-well 274 contains heavily doped sub-regions, including: (i) heavily doped P-type region 293 that underlie silicide 295 and corresponding electrical contacts 282; (ii) an extended high-doped P-type region 292 that extends between the heavily doped p-type sub-regions 293; (iii) heavily doped N-type region 298; and (iv) a shallow-trench isolation (STI) region 290 separating the heavily doped sub-regions. The presence of STI isolation region, which is typically filled with silicon-dioxide insulating material, provides near ideal structural and electrical isolation of the neighboring silicon regions, and enables the proximity of the isolated region to be reduced proving a smaller aerial (plan view) footprint on a product die.

Figure 2G:
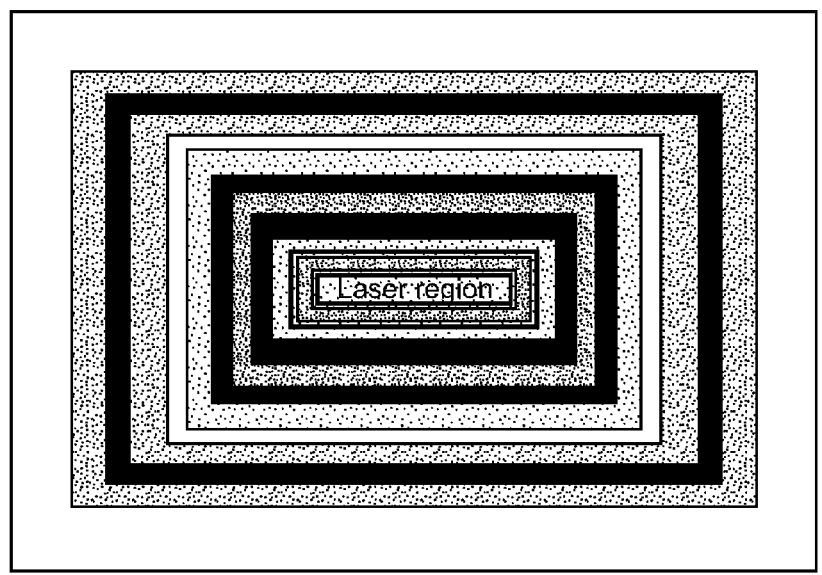
FIG. 2G illustrates a layout of FIG. 2F.
Figure 2F:
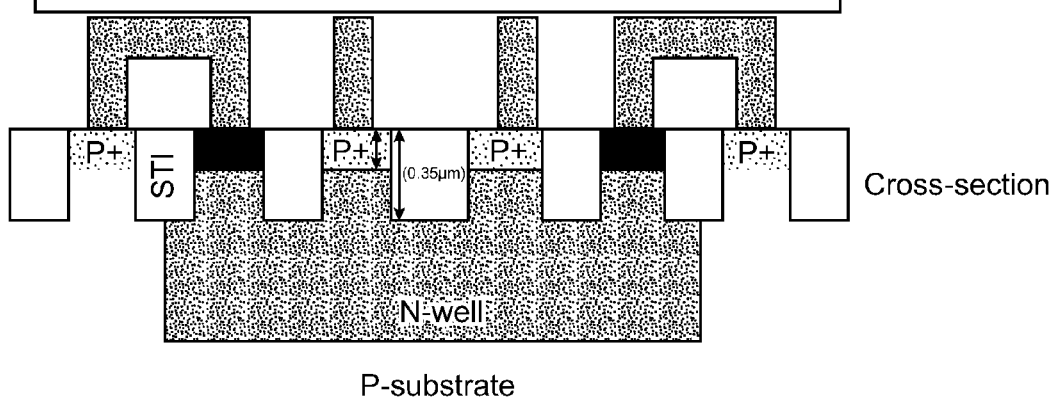
FIG. 2F illustrates a variation to an embodiment of FIG. 2D, under another embodiment.

FIG. 2F illustrates a variation to an embodiment of FIG. 2D, under another embodiment. FIG. 2G illustrates a layout of FIG. 2F. More specifically, as with an embodiment of FIG. 2D, an N-type region 274 (n-well) is formed within a P-substrate 280 and heavily doped sub-regions are formed on the P-substrate 280, on which contact elements 282 are provided. The N-well 274 contains heavily doped sub-regions, including: (i) heavily doped P-type region 293 that underlie silicide 295 and corresponding electrical contacts 282; (ii) an extended high-doped P-type region 292 that extends between the heavily doped p-type sub-regions 293; (iii) heavily doped N-type region 298; (iv) a shallow-trench isolation (STI) region 290 separating the heavily doped sub-regions; and (v) an STI region that defines the laser transparent region. The presence of STI region within the laser transparent region enables the structure to be defined without the need of a salicide blocking mask in the manufacturing process flow. This simplifies and saves processing cost and eliminates the need for the salicide blocking mask costs.

Figure 2I:
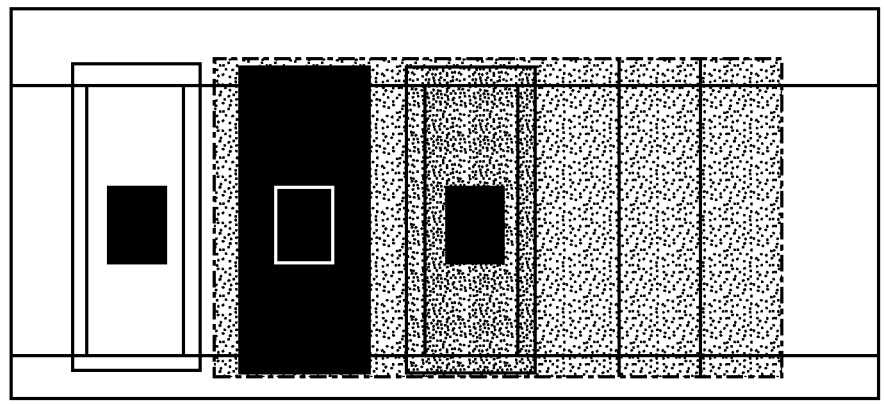
FIG. 2I illustrates a layout of FIG. 2H.
Figure 2H:
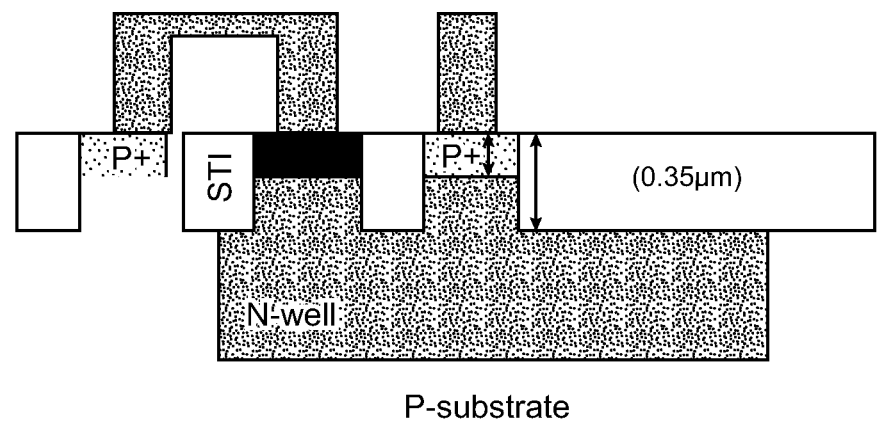
FIG. 2H illustrates a variation to an embodiment of FIG. 2E, under another embodiment.

FIG. 2H illustrates a variation to an embodiment of FIG. 2F, under another embodiment. FIG. 2I illustrates a layout of FIG. 2H. More specifically, by limiting the junction contact regions to only a small rectangle on only one side of the STI laser transparent region, the photodiode is reduced to its smallest aerial footprint configuration. This provides a more efficient use of real estate on a product die while trading off the increased resistance of the junction regions.

Photovoltaic Generation in SOI

Figure 3:
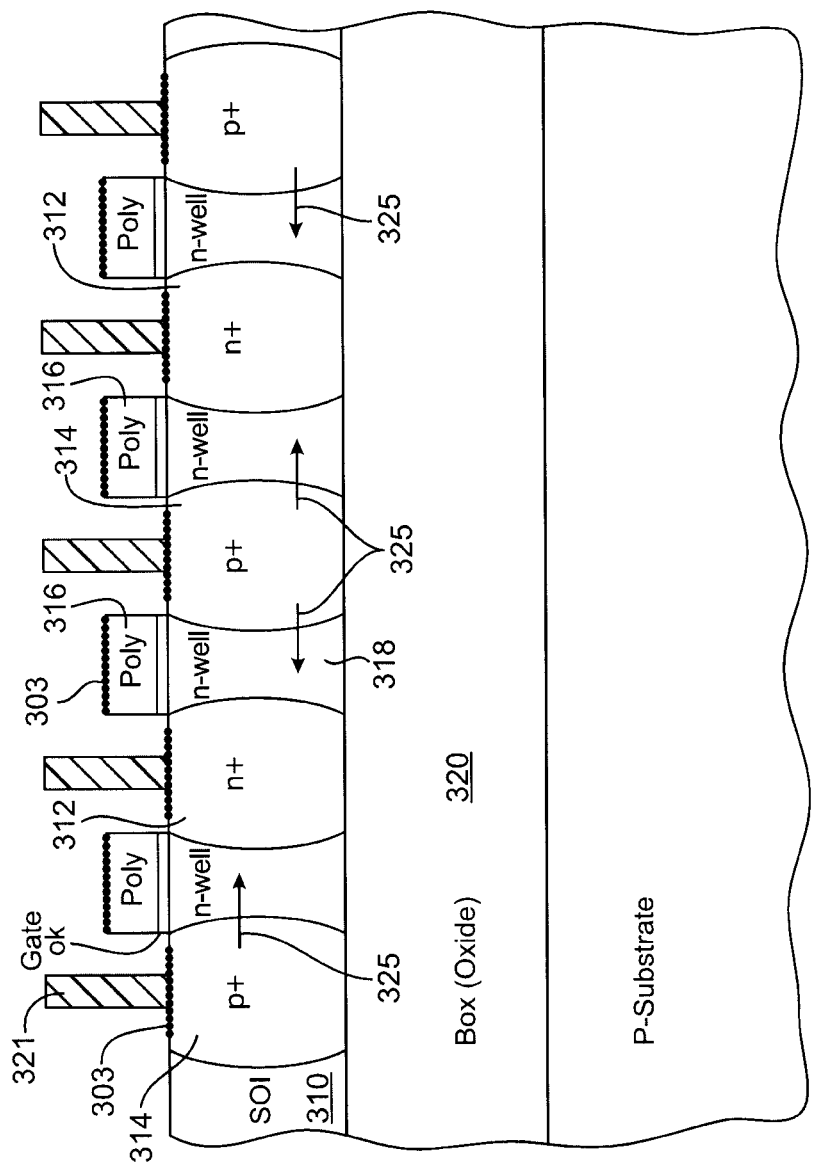
FIG. 3 illustrates a silicon-on-insulator (SOI) horizontal film photodiode, according to an embodiment.

FIG. 3 illustrates a silicon-on-insulator (SOI) horizontal film photodiode, according to an embodiment. In contrast to bulk devices (see FIGS. 1, 2A and 2B), where junctions tend to be vertical, SOI devices are generally built horizontally on a very thin layer (e.g. less than 1000 Angstroms) of single crystal silicon 310 above an insulating (typically oxide) layer 320. In the case of SOI devices, N- and P-type regions are implanted into the thin silicon layer 310, with the implant typically going all the way down to the insulating layer 320. As a result, photovoltaic PN junctions 325 are formed horizontally, rather than vertically, and any device designed for photovoltaic power generation must take this into consideration.

According to one or more embodiments, photovoltaic power generation on SOI substrates devices may include some or all of the following features and considerations. In one embodiment, a fingered (inter-digitated) set of doped regions are formed to include alternating narrow strips of N-type regions 312 and P-type regions 314, with P-type regions 312 being electrically connected to form the photovoltaic anode, and the N-type regions 314 also being electrically connected to form the photovoltaic cathode. Diffusions or implants normally self-aligned by polysilicon 316 or other layers in the 'standard' product process flow, may alternatively be defined by masks alone, taking into account degradation in overlay accuracy. In an embodiment depicted by FIG. 3, no silicide blocking region is provided, other than spacing between formations of silicide 303 and electrical contacts 321. The PN junctions 324 are horizontal, extending from heavily doped P-type region 314 (strip) to an adjacent N-type region 312 and N-well 318.

Figure 4:
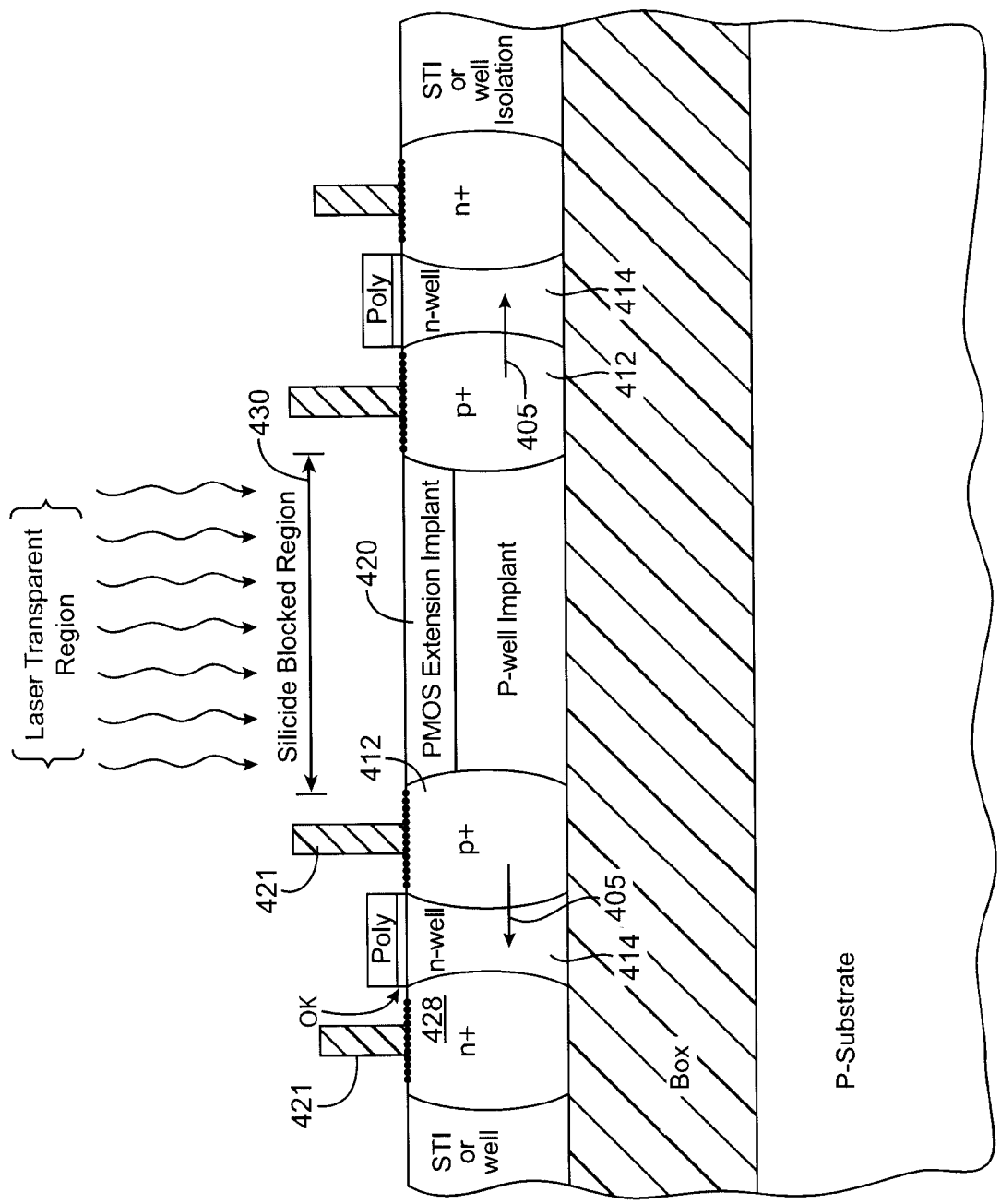
FIG. 4 illustrates a variation to an embodiment such as shown by FIG. 3.

FIG. 4 illustrates a variation to an embodiment such as shown by FIG. 3. In FIG. 4, a photovoltaic semiconductor device comprises (i) a set of doped regions are formed to include alternating narrow strips of P-type regions 412 and N-type regions 428, with P-type regions 412 being electrically connected to form the photovoltaic anode, and the N-type regions 428 also being electrically connected to form the photovoltaic cathode; and (ii) a shallow P-type extension area 420 that is integrated with a P-well to provide a large collection region for collecting electron-hole pairs (with application of light). The photodiode 405 is formed horizontally, to extend from the narrow strip P-type region 412 to the adjacent narrow strip N-type region 428. In the example shown, shallow P-type extension area 420 is heavily doped and integrated with a P-well. A laser transparent region 430 is formed (i) over the extension area 420, and (ii) partially over the adjacent P-type region 412 that forms an anode of photodiode 405. A substantial portion of the P-type region 412 is blocked to light by contacts 421 and/or silicide 403. Other metal contacts 421 are deposited (over silicide 403) to form terminal ends of respective heavily doped P and N regions 412, 428. As with other embodiments, for example, the electrical contact 421 extended over the N-type region 428 may be used to create electrical isolation by extending electrical contact to another P-type region (not shown).

As shown by an embodiment of FIG. 4, a mirror arrangement of P and N regions 412, 428 may be formed on an adjacent end of the P-type extension area 420 to form the photodiode 405 in an opposite direction.

In a variation to an implementation shown by FIG. 4, diffusions or implants normally self-aligned by polysilicon 416 or other layers in the 'standard' product process flow, may be defined by masks alone, taking into account degradation in overlay accuracy.

With regard to embodiments such as depicted by FIGS. 3 and 4, as well as elsewhere in the document, dimensions of the active P and N-type regions 412 and 428 are selected such that the photodiode 405 output impedance is enhanced or optimized. Considerations for the enhancement/optimization include (i) the resistivity of the diffused layers, (ii) the collection efficiency, (iii) carrier diffusion, and (iv) depletion region characteristics. Furthermore, embodiments recognize that the effective impedance of the individual P and N-type regions 412, 428 are reduced by selecting and forming multiple metal contacts in that region to contain a highly-conductive metal layer. Such a metal layer reduces the distance charge must flow through the relatively higher resistance doped silicon. As an example of improving the efficiency of collecting carriers generated with application of light, this may be enhanced by reducing the distance across which minority carriers must diffuse, and by minimizing the presence of oppositely charged carriers, thereby reducing unwanted electron-hole recombination (such as by reducing dopant concentrations in the p-well Implant 427).

Still further, one or more embodiments enable control of capacitance of the PN junctions through control of either the number of adjacent P and N 'fingers', or by controlling the doping within the adjacent P and N regions. For instance, a lightly doped PN horizontal junction will have a larger depletion width than will a heavily doped PN horizontal junction; hence the capacitance of the heavily doped structure will be larger. Such an embodiment can be used to control the AC output impedance of this structure in order to optimally power an AC electrical test structure.

Moreover, one or more embodiments may involve use of a standard process, as defined for the products being manufactured, in non-standard or atypical ways.

Figure 5:
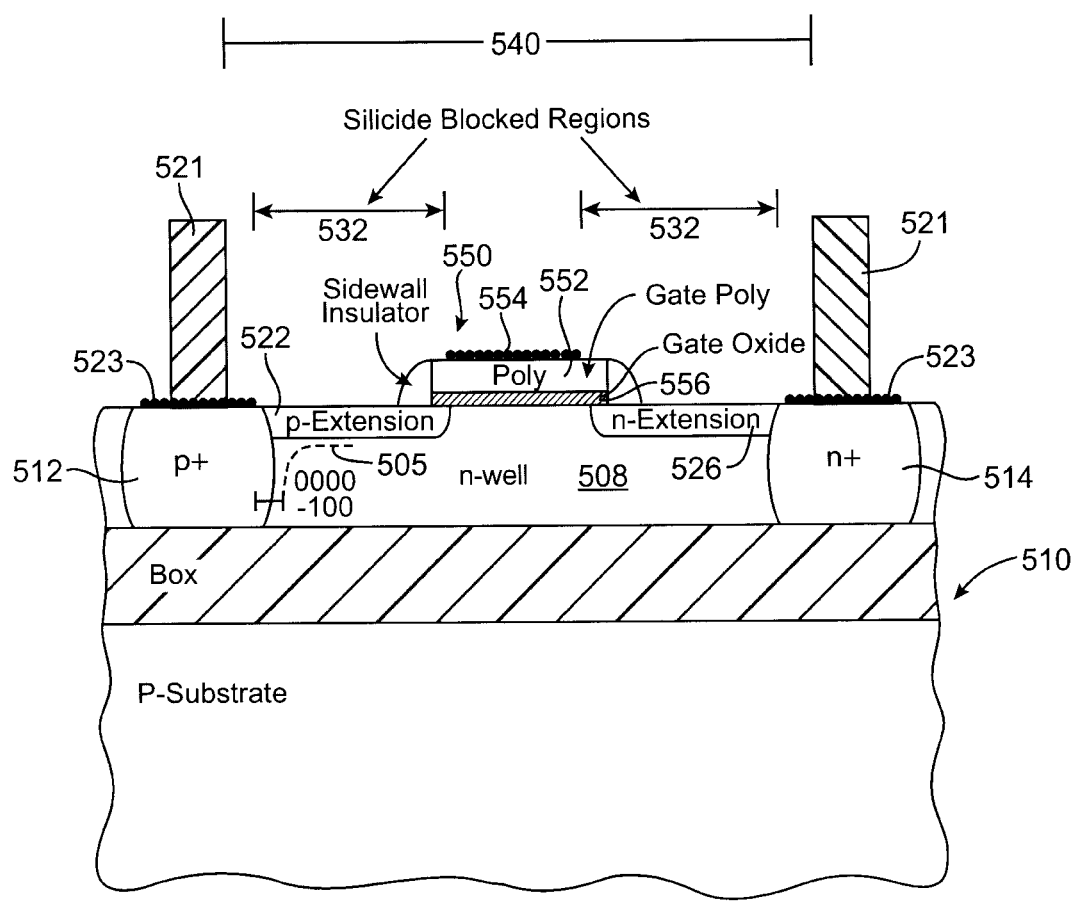
FIG. 5 illustrates formation of a photodiode on an SOI substrate, according to another embodiment.

FIG. 5 illustrates formation of a photodiode on an SOI substrate, according to another embodiment. In an embodiment of FIG. 5, the photovoltaic PN junction 505 includes a vertical component, rather than being substantially horizontal such as shown by embodiments of FIG. 3 and FIG. 4. In an embodiment, the SOI substrate 510 includes an n-well 508 having heavily doped finger regions of P-type 512 and N-type 514. The SOI structure may have thickness dimensions that range of the order of 500 to 1000 Angstroms. The P-type finger region 512 is bordered by the N-well 508 and by a P-surface extension 522. Each of the P-type finger 512 and N-type finger 514 includes contact elements 521 (formed over material such as silicide).

According to an embodiment, the P-surface extension 522 is formed to substantially aligned with one of the laser transparent regions 532 formed over the substrate. The combination of the P-type finger region 512 and P-surface extension 522 form a corner element that provide one node of the photodiode (or photovoltaic PN junction) 505. In this way, the photodiode 505 includes a vertical and horizontal element. With application of light, the current flow is generated into the N-well 508 in both horizontal and vertical directions from the corner element formed by the combination of the P-type finger region 512 and P-surface extension 522.

The P-type finger 512 and N-type finger 514 are separated by an open region 540, which in an implementation shown, is optionally divided by self alignment structure 550. In one implementation, the self-alignment structure 550 includes formations of polysilicon 552, silicide 554, and gate oxide 556. The silicide 554 may be applied to the structure in order to lower the conductivity of the region. The combination provide a dummy structure that enable critical dimensioning to surpass that which would otherwise be attainable from lithographic processes. Thus, without the dummy region formed by the structure 550, the region would have to be defined by lithography, which has critical dimensions that are greater than those provided with use of the self-alignment structure 550.

A second laser transparent region 535 may be formed above the heavily doped n-extension 526 that extends to the N-type finger region 514, thereby exposing an addition area in which electrical carriers are generated with the application of light. This combination of heavily doped N-type regions provide the cathode terminal for collecting current generated from application of light.

Figure 6:
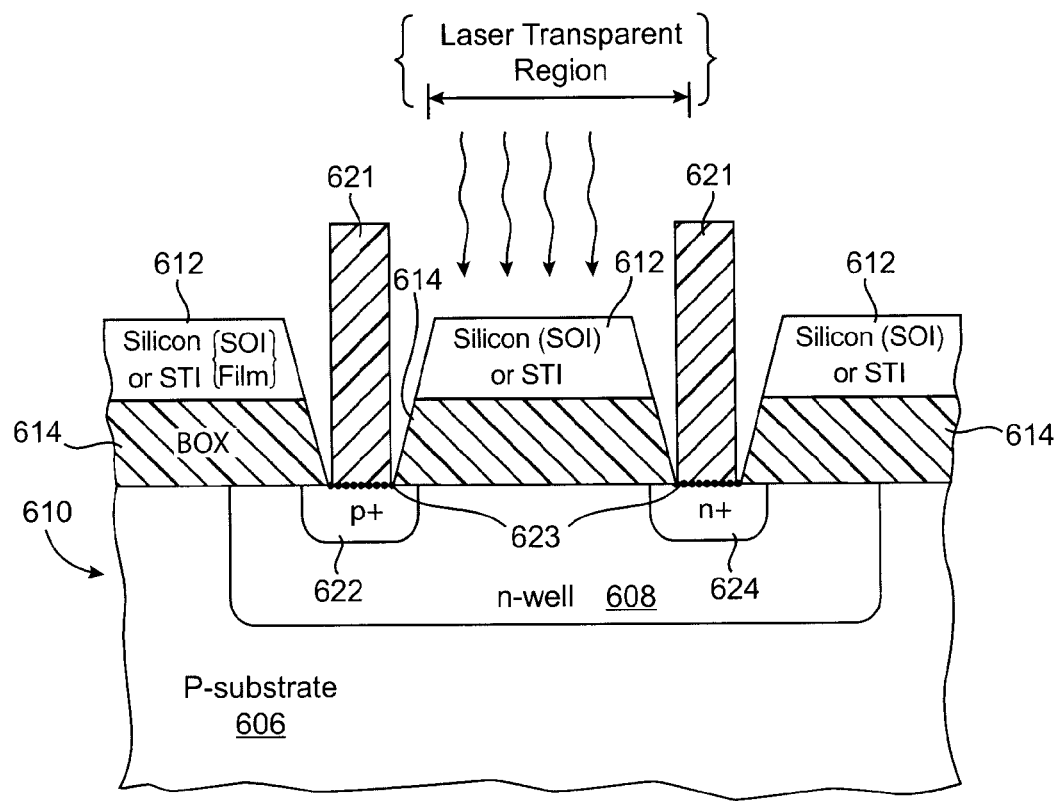
FIG. 6 illustrates a substrate having an integrated photovoltaic embedded PN junction, formed under a light transparent region, so as to be submerged beneath the buried oxide (BOX) layer within a thickness of the substrate, under another embodiment.

FIG. 6 illustrates a substrate 610 having an integrated photovoltaic embedded PN junction, formed under a light transparent region, so as to be submerged beneath the buried oxide (BOX) layer 614 within a thickness of the substrate 610, under another embodiment. As depicted, substrate 610 includes several layers, including a silicon crystal layer (i.e. SOI or STI film) 612 and BOX layer 614. Electrical contacts 621 are at least partially formed over silicide 623 (or other suitable material). Silicide 623 may be assumed to be opaque, while the silicon crystal layer 612 and box layer 614 are transparent, at least to the laser. The substrate 610 includes a N-well 608 provided on a P-type substrate 610.

A PN junction 620 is formed by heavily doped P-type and N-type regions 622, 624 respectively. A light (i.e. laser) transparent region 625 may be formed over a region of the substrate between the respective P-type and N-type regions 622, 624. The light transparent region 625 coincides with a structure of the silicon crystal layer 612 and box layer 614, as well as portions of the heavily doped P-type and N-type regions 622, 624 and the N-well 608. Each of the heavily doped P-type and N-type regions 622, 624 is only partially obstructed to light by corresponding silicide 623. As described with an embodiment of FIG. 2A, with application of suitable light, electron hole generation is initiated from the PN junction that is formed by the heavily doped P-type region 622, N-well 608 and highly-doped N-region 624. The PN junction is formed with a substantial vertical component, to provide a photodiode that can power circuits (e.g. See FIG. 14). Optionally, as described with some other embodiments, the electrical contact 621 may be extended from the heavily doped N-region to another highly-doped P-region to electrically isolate the PN junction with the application of light.

With further reference to an embodiment of FIG. 6, the particular type of structures formed as part of the silicon crystal layer may vary, particularly in geometry and size. Nevertheless, as depicted, suitable laser transparent region(s) may be created through designed non-use of opaque material, such as silicide 623 and electrical contacts 621. The particular thickness and/or topography of the substrate 610 may be treated as a design constraint for which the resulting photodiode may be provided to power circuit elements such as test structures.

Figure 7:
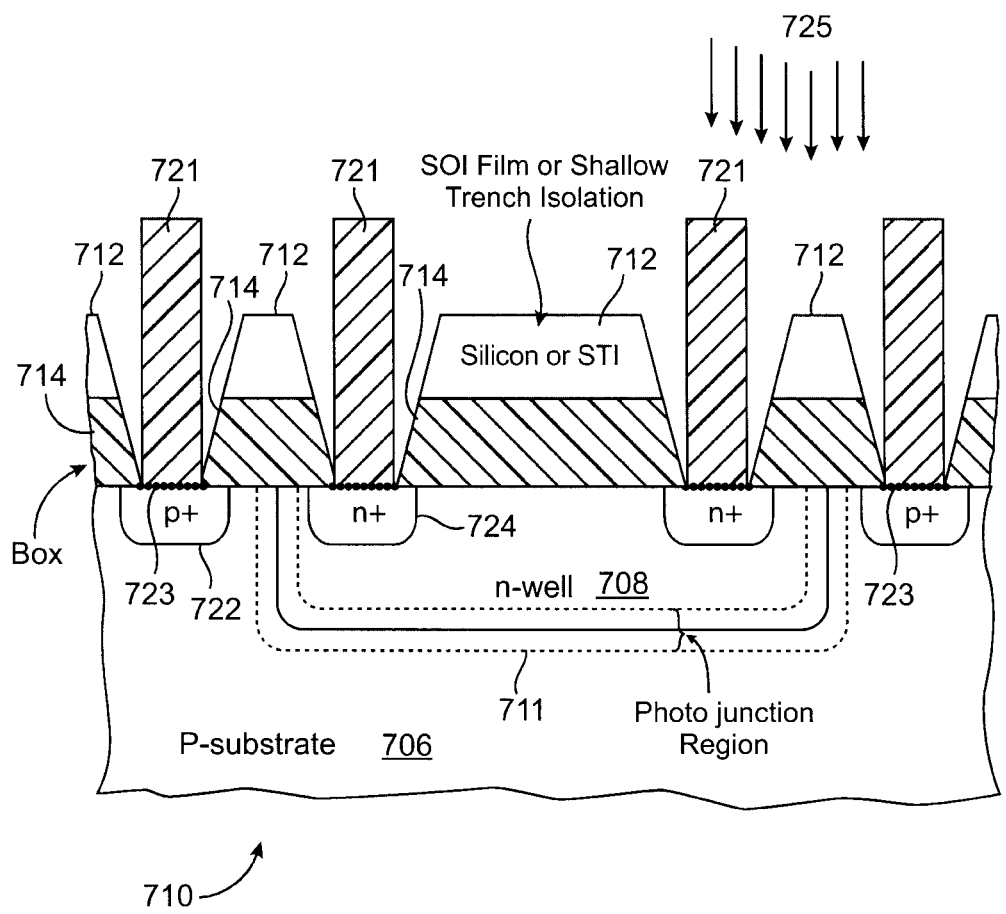
FIG. 7 illustrates a variation to an embodiment of FIG. 6, in which a substrate includes a submerged or embedded photovoltaic PN junction, under another embodiment.

FIG. 7 illustrates a variation to an embodiment of FIG. 6, in which a substrate 710 includes a submerged or embedded photovoltaic PN junction, under another embodiment. Substrate 710 includes several layers, including a silicon crystal layer (i.e. SOI or STI film) 712 and box layer 714. Electrical contacts 721 are at least partially formed over silicide 723 (or other suitable material). Silicide 723 is assumed opaque, while the silicon crystal layer 712 and box layer 714 are transparent, at least to the laser. The substrate 710 is P-type.

In contrast to an embodiment of FIG. 6, the N-well 708 includes highly-doped N-type regions 724 on which electrical contacts 721 are extended. Heavily doped P-type regions are provided outside of the N-well. One or more of the highly-doped P-type regions 722 are positioned to be partially non-occluded by the silicide 723 or electrical 721 to receive light. In this way, one or more light transparent regions are provided over the substrate 710 to coincide with, at least some portions of one or more of the highly-doped P-type regions 722. In one embodiment, at least two highly-doped P-type regions 722 are formed to partially coincide with the light transparent regions 725. Once electron hole generation is initiated with light, electron hole pairs are migrated across the boundary with the N-well 708. This migration corresponds to PN junction 720. The resulting PN junction this spans substantially the boundary of the N-well 708.

Figure 8:
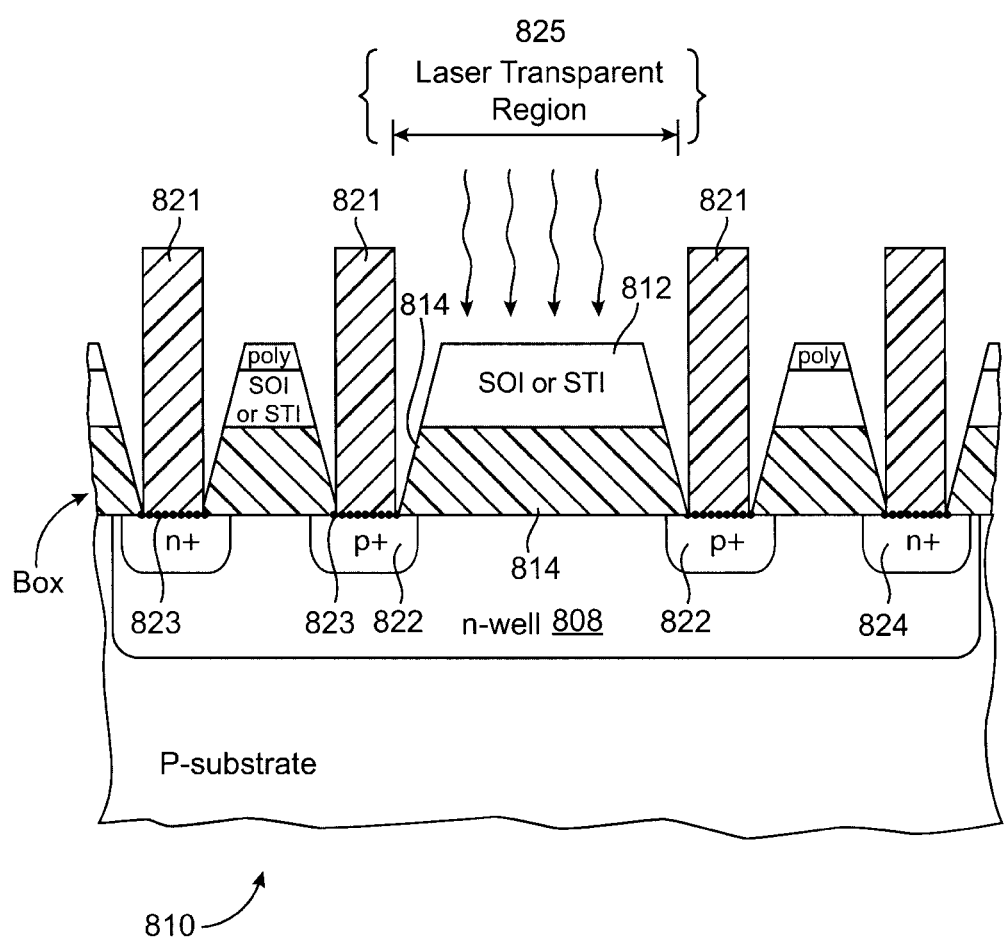
FIG. 8 illustrates a variation to embodiments of FIG. 6 and FIG. 7, in which a substrate includes a submerged or embedded photovoltaic PN junction, under another embodiment.

FIG. 8 illustrates a variation to embodiments of FIG. 6 and FIG. 7, in which a substrate 810 includes a submerged or embedded photovoltaic PN junction, under another embodiment. Substrate 810 includes a silicon crystal layer (i.e. SOI or STI film) 812 and box layer 814. Electrical contacts 821 are at least partially formed over silicide 823 (or other suitable material). Silicide 823 is assumed opaque, while the silicon crystal layer 812 and box layer 814 are transparent, at least to the laser. The substrate 810 includes an N-well 808 provided on a P-type substrate 806. In contrast to an embodiment of FIG. 7, the N-well 808 includes highly-doped P-type regions 822. As an addition, highly-doped N regions 824 are also included within the N-well 808. As mentioned with some other embodiments, each of the highly-doped P and N-type regions may be partially overlaid with silicide 823, so that some portions of the respective regions is exposed outside of the opaque material. In this way, at least one light transparent region 825 is provided over the substrate to overlap partially with both of the highly-doped P-type regions 822 (in configuration depicted).

The two heavily doped P-type regions 822 create a photodiode junction 820 with the N-well 808. An embodiment such as depicted improves the collection efficiency of the generated electron hole pairs, as compared to using, for example, just one heavily doped P-type region. The heavily doped N-type region 824 surrounds the electron hole generation region to reduce resistive effects, while providing some electrical isolation.

Figure 9:
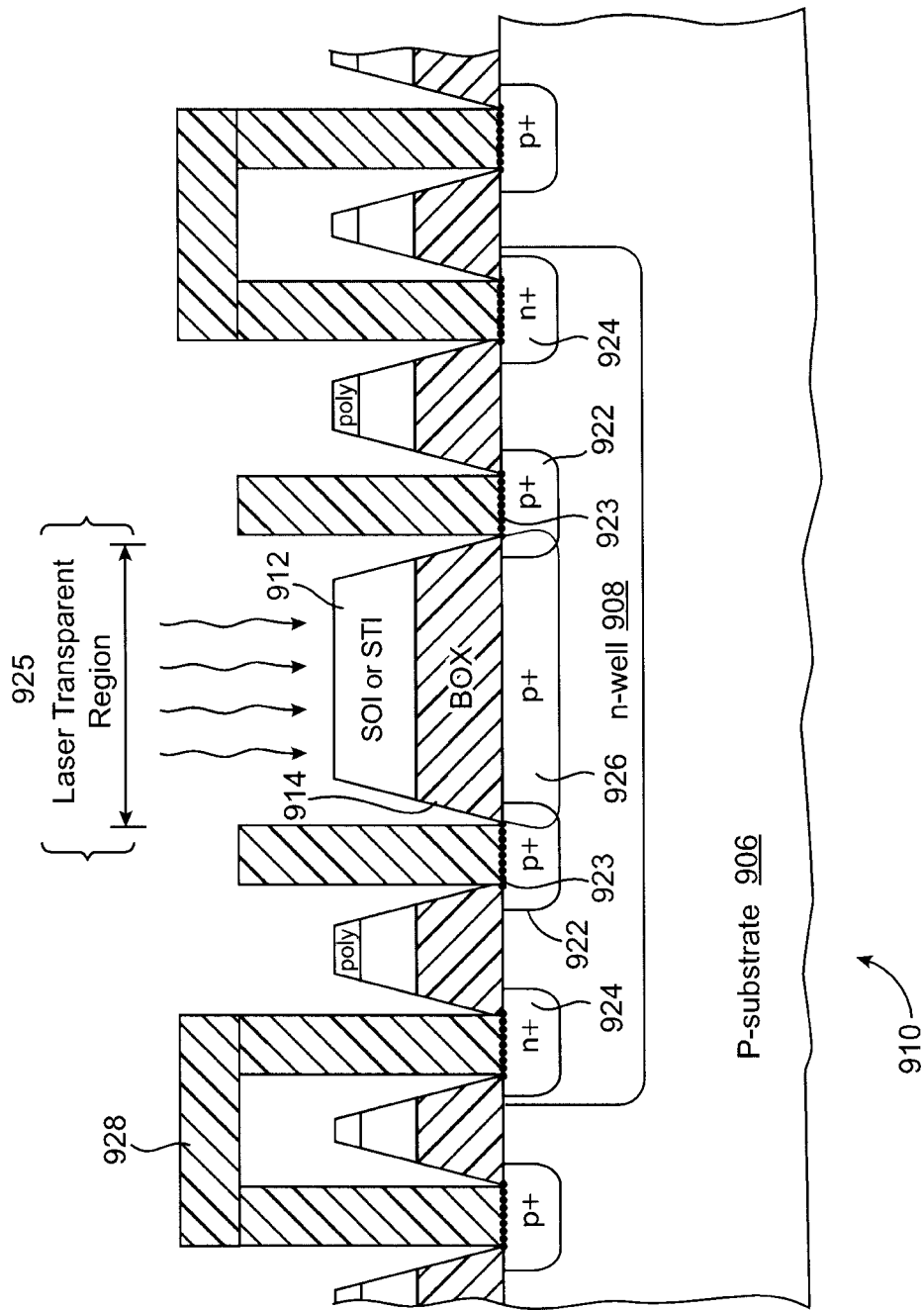
FIG. 9 illustrates yet another variation to embodiments of FIG. 6 through FIG. 8, in which a substrate includes a submerged or embedded photovoltaic PN junction, according to another embodiment.

FIG. 9 illustrates yet another variation to embodiments of FIG. 6 through FIG. 8, in which a substrate 910 includes a submerged or embedded photovoltaic PN junction, according to another embodiment. Substrate 910 includes a silicon crystal layer (i.e. SOI or STI film) 912 and box layer 914. Electrical contacts 921 are at least partially formed over silicide 923 (or other suitable material). Silicide 923 is assumed opaque, while the silicon crystal layer 912 and box layer 914 are transparent, at least to the laser. The substrate 910 is assumed to be P-type. In contrast to an embodiment of FIG. 7, the N-well 908 includes highly-doped P-type regions 922. As a variation to an embodiment of FIG. 8, the P-type regions 922 include a P-type extension region 926 that extends substantially a length of the corresponding light-transparent region 925. The combination of the heavily doped P-type regions 922, 926 within the N-well 908 forms the PN junction 920. As described with, for example, an embodiment of FIG. 2B, the extension of the heavily doped P-type region 926 enhances the collection efficiency of generated electron hole pairs. As described with FIG. 8, highly-doped N regions 924 may be included within the N-well 908 to isolate the generation area.

As mentioned with some other embodiments, each of the highly-doped P and N-type regions (not including extension area 926) may be partially overlaid with silicide 923, so that some portions of the respective regions is exposed outside of the opaque material. The light transparent region 925 may be provided over the substrate 910 to overlap partially with both of the highly-doped P-type regions 922 (in configuration depicted) and the substantial portion of the P-extension 926. Among other benefits, the use of the P-type extension 926 improves resistivity and increases the collection efficiency. The P-type extension 926 also enlarges the PN junction 920, so as to further enhance the efficiency of the resulting photodiode.

As described with some other embodiments, the heavily doped N-type regions 924 which form the collection area for the photodiode may be 'shorted' with electrical contacts 921 that extend to heavily doped P-regions 928. As mentioned previously, such shorts electrically isolate the photodiode.

Bottom Side Photodiode Illumination on Substrate

Numerous embodiments described elsewhere in this document provide for photodiodes that use top-side light generation. As described, at least some of the embodiments described use a laser transparent region, corresponding to a designed region on the substrate device or semiconductor that is cleared of structures or opaque material (such as silicide).

Figure 10:
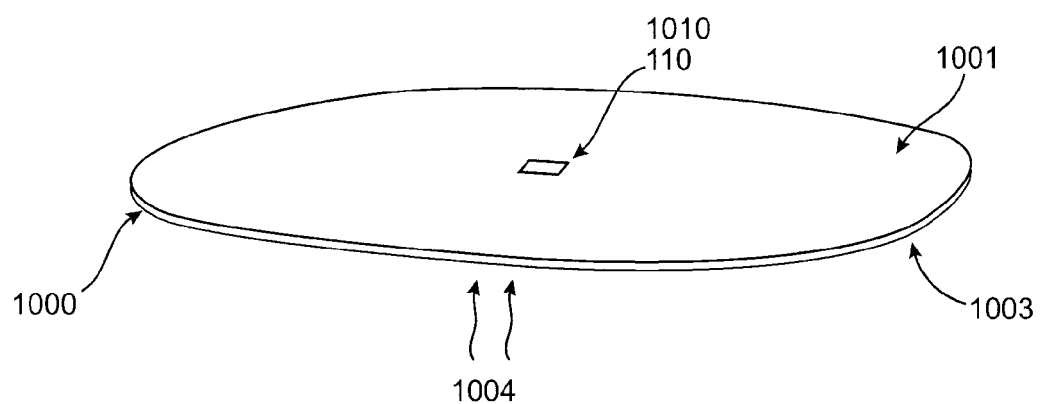
FIG. 10 illustrates a general schematic of how a bottom-side light illuminating configuration may be employed for purpose of powering a photodiode (and corresponding test structures).

As an alternative so such embodiments, one or more embodiments provide for use of bottom-side light application or illumination. FIG. 10 illustrates a general schematic of how a bottom-side light illuminating configuration may be employed for purpose of powering a photodiode (and corresponding test structures). A wafer 1000 includes a top surface 1001 on which active circuitry is naturally formed, and the bottom surface 1003 opposes the front surface 1001 and includes no active circuitry. A test structure or device under test 1010 may be provided on the top surface 1001.

Embodiments recognize that in silicon, for example, light can generate carriers which ultimately can migrate across a thickness of a substrate to be collected in appropriately doped regions on an opposing side or thickness of the substrate. Accordingly, in one embodiment, laser illumination occurs from the backside 1003 of the wafer 1000.

In more detail embodiments recognize that wafers typically have lightly P-doped mono-crystalline silicon of thickness about 750 microns (between surfaces 1001 and 1003). Illumination 1014 may be applied to the backside of the wafer 1000, beneath, for example, an N-well implant that includes the photodiode. With application of light, both electron and hole carriers are generated. The carriers are able to migrate through the thickness of the wafer, and can be captured by diffusions placed adjacent or near the top surface 1001.

Figure 11:
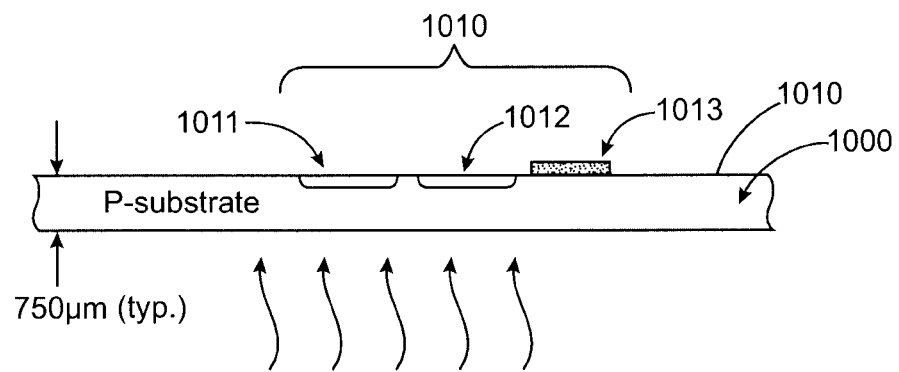
FIG. 11 illustrates additional details for constructing an integrated photodiode in a wafer to support backside illumination, under an embodiment.

FIG. 11 illustrates additional details for constructing an integrated photodiode in a wafer to support backside illumination, under an embodiment. In one implementation, photodiode 1010 is constructed by implanting a heavily doped N-type region 1011 and heavily doped P-type region 1021 into the lightly-doped P-type substrate of the wafer. Electrons generated by the optical power 1014 diffuse into an N-type region 1011, thereby lowering its potential relative to the substrate as contacted via P-type region 1021. Designed properly, and with enough photo-carriers, the potential within the N-type region 1011 can drop to approximately −0.7 Volts, and this potential can be used to power the active circuitry 1012.

Such an embodiment may be implemented using an N+ implant into a P-doped substrate 100, in which case the voltage generated within the N-type region has a negative potential (−0.7 V approximately) relative to the substrate 1000. Such an embodiment may also be implemented with a P-type implant into an N-doped substrate 1000, in which case the voltage generated within the heavily doped P-type region has a positive potential (+0.7V approximately) relative to the substrate 1000.

Figure 12:
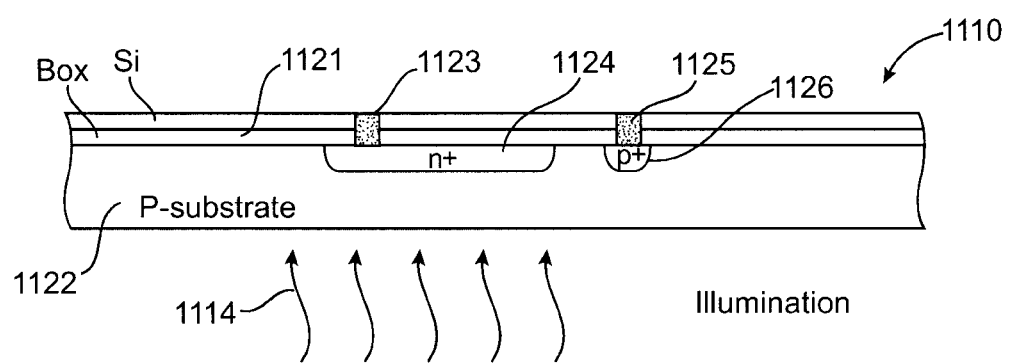
FIG. 12 illustrates an alternative variation to an embodiment such as shown by FIG. 11, under an embodiment.

FIG. 12 illustrates an alternative variation to an embodiment such as shown by FIG. 11, as implemented on an SOI substrate device 1110. In an embodiment, a heavily doped sub-region of N-type material (N-type region 1124) is formed in the P-doped substrate 1122 beneath the buried oxide BOX layer 1121. Contact to the N-type region 1124 may be made through the box layer 1121 using a substrate contact via 1123. A tap must also connect to the P-doped substrate 1122 using a P-type implant 1126 and a second contact via 1125 through the box layer 1121. Electrons created in the substrate 1122 by the backside illumination 1114 drift through the P-type substrate 1122 until they are captured by the heavily doped N-type region 1124. A potential of approximately +0.7V can be created between the P-type contact 1125/1126 and the N-type contact 1123/1124, and this potential can be used to exercise active circuitry built on the silicon-on-insulator (SOI) material 1120.

Because the silicon thickness is of the order of 750 microns, the carriers must diffuse this relatively long distance before they recombine. It is thus preferable to use a relatively long wavelength illumination 1114 such that the photo-carriers can be generated deep within the substrate 1122 (as close as possible to the absorption region 1124). Suitable wavelengths are those that are relatively long, but below the silicon bandgap wavelength. As an example, for silicon, a good wavelength could be 1064 nm, which has a relatively long absorption distance within silicon. Conversely, 300-nm light would, under an implementation described, be absorbed almost immediately at the bottom surface 1102.

Embodiments described herein include semiconductor substrates (i.e. comprising sections or portions of wafers) that include integrated photodiodes for powering circuits and other components, particularly test structures or circuits when the semiconductor substrate is in only a partially manufactured state. U.S. Pat. Nos. 7,220,990, 7,339,388, and 7,423,288 (each of which are incorporated by reference in their entirety for all purposes) individually describe use of test structures or circuits that can be powered on-chip, for purpose of achieving non-contact, non-destructive test signal generation (and subsequent analysis) when semiconductor substrates are only in a partially fabricated state. Numerous embodiments described herein provide for the formation of integrated photodiodes that can power such circuits and structures using application of light (e.g., laser).

Figure 13:
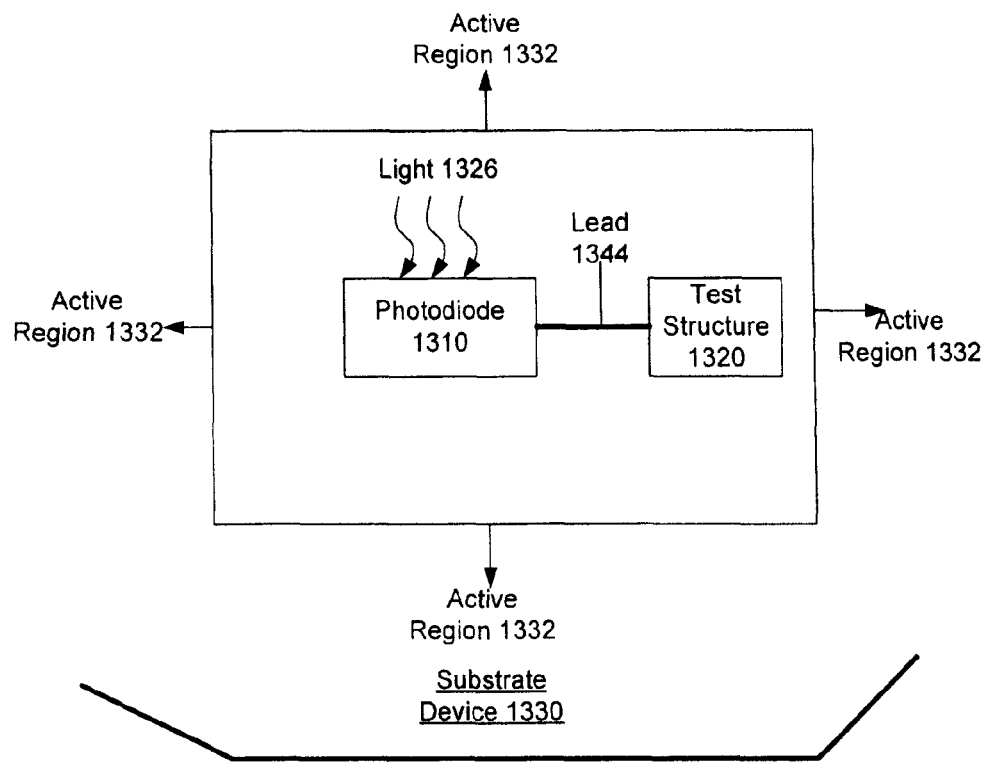
FIG. 13 illustrates an application of an integrated photodiode, according to one or more embodiments.

FIG. 13 illustrates an application of an integrated photodiode, according to one or more embodiments. In FIG. 13, an enhanced integrated photodiode 1310 is used to power one or more test structures 1320 on a semiconductor substrate device 1330. The photodiode 1310 may be formed in accordance with any of the embodiments described above. Thus, the photodiode 1310 may correspond to formations of (highly) doped and adjacent P and N type regions, provided on the substrate device 1330 to be coincidental with a light transparent region.

The substrate device 1330 may be of a type described with the appropriate embodiment (e.g. bulk silicon, SOI etc.). Depending on the application, substrate device 1330 may be in either a partially completed state or in a fully completed state. In one embodiment, the substrate device 1330 is part of a semiconductor wafer that is in a partially fabricated state. In such an embodiment, the photodiode may be used to power one or more test structures, circuits or devices under test. Numerous arrangements and configurations are contemplated for enabling use of one or more enhanced photodiodes to power test structures. Among them, (i) one integrated photodiode 1310 may be used to power multiple test structures 1320; (ii) photodiode and/or test structures 1320 may be positioned in the active region 1332 of the semiconductor substrate (e.g. in the chip), or alternatively in the scribe or outside of the active region; (iii) proximity of the photodiode 1310 to the test structures 1320 may also vary.

In forming effective integrated photodiode 1310, embodiments recognize considerations that include (i) the ability of the photodiode(s) to supply sufficient power, (ii) efficiency of photodiodes, and (iii) stability that accommodate standard manufacturing and design practices, constraints and considerations for integrated circuit fabrication. Such standard silicon manufacturing may include amongst others, bulk silicon and Silicon On Insulator (SOI) processes and design.

According to one or more embodiments, photodiode 1310 is formed on semiconductor substrate 1330 with ability to (i) convert power from an optical source (e.g. laser), (ii) to supply power from applied light 1326 (e.g. laser) to run an electrical circuit and test structure. One or more leads 1344 (i.e. contact elements) may extend from the photodiode 1310 to the test structure 1320 and/or other structures/devices that are to be powered from the photodiode. In at least some embodiments, the integrated photodiode 1310 is fabricated as part of the semiconductor substrate 1330 within device design manufacturing constraints defined for the original purpose of the semiconductor substrate (e.g. the silicon wafer).

Still further, one or more embodiments provide that the photodiode 1310 that includes properties or characteristics that accommodate the constraints of the wafer manufacturing process. One or more embodiments provide that the photodiode 1310 is constructed to optimize (or at least fall within) parameters and considerations of the design and manufacturing process for the semiconductor substrate. Specifically, some embodiments described herein include photovoltaic photodiodes that are constructed to operate within the design and process constraints and optimized for selected applications. Applications for use with one or more embodiments include design and manufacturing analysis, control of wafer fabrication and design processes, circuit performance, integration of process with design, and device process and design characterization.

Manufacturing/Design Semiconductor Substrates with Integrated Photodiodes

Figure 14:
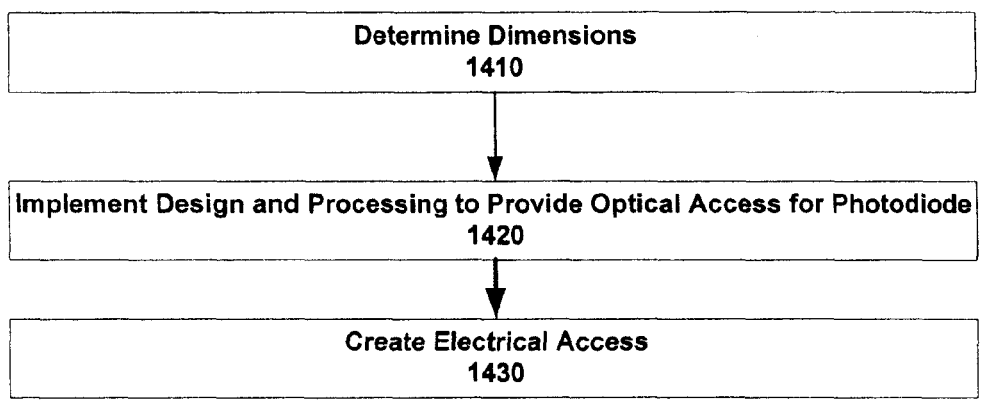
FIG. 14 describes a technique of method for forming integrated photodiodes in a semiconductor substrate, according to one or more embodiments.

FIG. 14 describes a technique of method for forming integrated photodiodes in a semiconductor substrate, according to one or more embodiments. A technique such as described may be implemented to form some or all of the integrated photodiode structures described above with FIGS. 1-9.

In step 1410, the dimensions of the light transparent region, as well as the elements that are to comprise the photodiode (e.g. heavily doped P-regions, N-regions etc.) photodiode are determined. Such dimensions may be based at least in part on considerations that include power generation and manufacturing constraints. The amount of power that the photodiode is to generate (e.g. number and type of test circuits that are to be made operational), the light source used (e.g. type of laser), and inherent manufacturing or substrate constraints (such as available access space) are factors that are used to dimension the photodiode. The application or use for the photodiode may further influence the dimensional requirements.

Once dimensioned, step 1420 implements design and processing steps to provide optical access for the photovoltaic devices. Thus, the fabrication process of the semiconductor substrate leads to the formation of both photodiode and test circuit(s). In order to implement effective use of photodiode 1310, some embodiments recognize the benefit in structuring the photodiode 1310 (and test structure 1320) to accommodate variations or other parameters of the fabrication process for the semiconductor substrate. In particular, some embodiments provide that both the photodiode 1310 and the driven electrical test structure 1320 are co-designed to be affected substantially equally by standard process variances associated with semiconductor manufacturing. In one embodiment, the photodiode 1310 and the test structure 1320 are co-designed such that the variations in the supply current of the electrical test structure, together with variations in the photovoltaic source, result in a designed limit on the variation of the photovoltaic voltage output. For instance, if test structures 1320 are produced on the semiconductor substrate 1330 and are expected to have a 10% variation across wafer as a result of manufacturing variations, then some embodiments provide that the photodiode 1310 is designed such that its output voltage varies less than a certain amount from nominal, given the variations in the current draw of the test structure.

In step 1430, electrical and optical isolation is created as necessary to enhance efficiency and performance of the photodiode. With regard to, for example, an embodiment of FIG. 2A or FIG. 9, the electrical isolation takes the form of the electrical shorts extended from the N+ region where electron hole generation is collected.

Once the photodiodes are formed on the substrate, step 1440 one or more embodiments provide for efficiently activating test structures with consideration for saturation or physical damage of the integrated photodiode that powers the activation. The activation of the test circuits using the photodiode may occur when the substrate device is in either fabricated and partially fabricated state. Numerous optional enhancements or optimizations may be performed to achieve more efficient activation of the test structures. These include one or more of the following.

In an embodiment, the photodiode may be designed to accept extremely bright light sources without having their response saturate. This is in contrast to conventional photoconductive detector devices that are normally optimized to receive weak optical signals.

In still another embodiment, the photodiode may be configured to produce a photocurrent at a regulated, constant and stable output voltage. Such design is in contrast to conventional photoconductive detector devices, which produce a photocurrent in proportion to a weak optical signal input at an externally-supplied fixed negative bias.

Still further, another embodiment provides that output leads 1344 (see FIG. 13) or circuit elements of an integrated photodiode are designed to have an impedance that substantially matches the circuit input impedance of the driven electrical test structure.

Still further, some embodiments provide for optimizing the formation and use of photodiode 1310 by designing the photodiode to have less than a designed limit for an output impedance at the operating frequency of the test structure 1320. For instance, if the test structure 1320 is a ring oscillator operable at 1 GHz, it may be beneficial for photodiode 1320 to appear as an AC short-circuit to such high frequencies, such that for all practical purposes the generated photovoltaic output voltage which is driving this ring oscillator appears constant with time. This implementation may be accomplished by increasing the capacitance and/or decreasing the resistance of the photodiode 1310: (a) increasing the PN junction area (step 1320) than beyond what is otherwise required to provide adequate power, by increasing area (horizontally and/or vertically), and/or using deep (in the vertical direction) substrate, and/or using vertical structures; (b) using thin-oxide capacitors, such as poly-to-well capacitors, poly-to-substrate capacitors, or metal-to-metal or metal-to-substrate capacitors, etc.; (c) decreasing resistance: using appropriate horizontal or vertical geometries, variations in series or parallel connections, or additional layers to form low impedance connections adjacent to or within the optically active areas; (d) creating capacitors, in any of the forms listed in (b) integral with the photodiode; (e) supplying local bypass capacitors, in any of the forms listed in (b), at critical nodes within the electrical test structure.

Still further, another enhancement provides for the photodiode 1310 to improve light collection subject to constraints imposed by the specific silicon (bulk and/or SOI) manufacturing process. Such embodiments recognize, for example, that although a P-type/N-type junction may be optimal for some situations, such designs may not be practical is some applications, such as when the p and n regions are covered in the manufacturing process by an optically opaque material such as silicide or metal. Accordingly, photodiode 1310 may be configured such that the optical collection efficiency of the device is maximized given constraints that can result in pool light collection.

As an addition or alternative, another enhancement in the formation of the photodiode 1310 includes designing (or optimizing) the photodiode 1310 to have sufficient voltage regulation and current generation capabilities in the presence of any required metal contacts, which are reflective to the optical power illuminating the device, or to a process step such as a silicide block, which may attenuate the incident the incident optical power. Still further, the photodiode 1310 may be structured to be insensitive, to within prescribed limits to beam placement of the optical power source onto the photosensitive area. Such prescribed limits may vary in range (e.g. range may vary by 10%, 5%, 3%, or 1%).

Another embodiment involves designing the photodiode 1310 such that its operation does not adversely affect the electrical test structures. Photovoltaic devices may be provided that, when implemented on, for example, a wafer, avoid electrical and optical cross-talk between devices and conductive elements.

Another embodiment for achieving sufficient optical efficiency is to design the N-type and P-type regions of the photodiode 1310 such that they are small enough to permit the rapid escape of photo-generated minority carriers. The design constraint should be that the number of photo-generated minority carriers per volume should be less than 10%, 1%, or 0.1% of their majority counterparts. For instance, if minority photo-carriers are generated at a certain rate (electrons or holes per volume per time), then this rate times the average time for these carriers to diffuse out of their minority region should be less than 0.1, 0.01, or 0.001 (depending on implementation or configuration being used) times the majority carrier density in that same region.

Another embodiment provides a method of building a PN photovoltaic device using heavily doped and highly-conductive polysilicon regions. For instance, a border between illuminated P-type and an N-type polysilicon region will also enable photovoltaic generation. Other variations include the junction between a P-type polysilicon layer and an N-type region of the silicon, or between an N-type polysilicon layer and a P-type region of the silicon.

A further embodiment allows the laser illumination to occur from the backside of the wafer. Typically wafers are P-doped mono-crystalline silicon of thickness about 750 microns. As illumination is applied to the backside of the wafer, beneath the photodiode, both electron and hole carriers will be generated. The carriers are free to diffuse throughout the silicon wafer, and can be captured by diffusions placed on the topside of the wafer.

Figure 15:
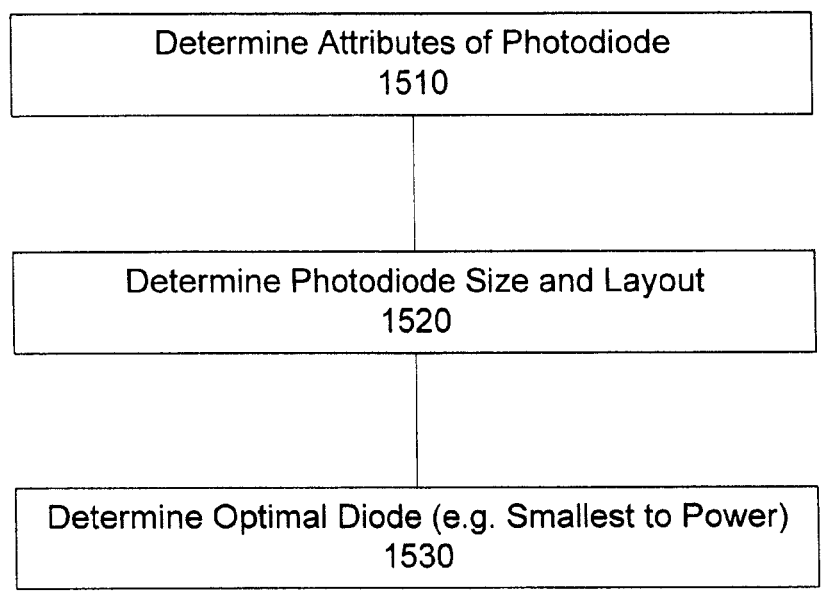
FIG. 15 illustrates a method for optimizing a design of a photodiode, according to some embodiments.

FIG. 15 illustrates a method for optimizing a design of a photodiode, according to some embodiments. In step 1510, the attributes of a photodiode are determined in order to power an integrated circuit. In particular, values are associated with the following attributes: (i) footprint size, to balance layout efficiency with need to maximize voltage across the diode; (ii) minimize extrinsic parasitic resistance; (iii) openness to illumination (avoidance of metal/silicide); (iv) good diode ideality behavior (e.g. low leakage, low level of defects); (v) close proximity of carrier generation region to intrinsic junction; (vi) the ability to short the nwell to the substrate region to create a positive reference (for p-n junctions isolated by the n-well).

In step 1520, the photodiode size and layout is determined. The determination may be made to operate in steep load line region to minimize circuit sensitivity to voltage variation.

In step 1530, a determination is made as to the smallest diode that can be obtained to provide sufficient power to operate the integrated circuit with minimal sensitivity to voltage variation.

Stacked Photodiode

With reference to prior embodiments, such as described with FIG. 12, in order elevate the generated power supply of a single photodiode structure as described in previous embodiments of this document by stacking the photodiodes in series, the generated power supply can be as much as double the voltage of a single photodiode. A further increase in power supply capability is achieved by stacking three photodiodes in series, which, when illuminated via laser light, could generate as much as triple the voltage of a single photodiode. A circuit schematic hookup is provided for a double stacked photodiode configuration. A cross section of an integrated photodiode device structure embodiment has terminal connections to properly power a given circuit. The isolation of the stacked photodiode configuration is critical to suppress unwanted parasitic leakage components that may undermine the potential at the terminals. An added PWELL doping region and STI insulting region between the two stacked photodiodes to mitigate or eliminate the undesirable leakage components via lowering the parasitic NPN's BETA and transport current. Further intentionally adjusting the spacing between the two photodiodes will provide an additive mitigation of the parasitic NPN's leakage components.

Variations to embodiments described herein may vary depending on whether the photovoltaic device is built on bulk silicon or on SOI substrates. SOI device structures, by virtue of being built atop an insulator and having the ability to encapsulate regions within insulating walls, can inherently prevent one region from affecting another independent region. In the case of bulk silicon, one common substrate connects all circuits built on the same wafer, hence there is potential for electro-optical activity in one region to affect activity in another region.

What is claimed is:

1. A semiconductor substrate comprising:
a circuit formed on the substrate;
a light transparent region formed on the substrate; and
a photodiode integrally formed on a surface of the substrate that coincides with the light transparent region to power the circuit, the photodiode being formed by a combination of doped regions, including at least two oppositely-doped regions that will generate a photovoltaic potential with application of light;
wherein the combination of doped regions that form the photodiode include a heavily doped P-type region that is integrated into an N-well.

2. The semiconductor substrate of claim 1, wherein the heavily doped P-type region includes a shallow extension within the N-well.

3. The semiconductor substrate of claim 1, wherein the photodiode further comprises a heavily doped N-region formed within the N-well.

4. The semiconductor substrate of claim 3, wherein the photodiode is electrically isolated at the heavily doped N-region of the N-well.

5. The semiconductor substrate of claim 1, wherein the semiconductor substrate is of a silicon on insulator (SOI)

type, and wherein the combination of doped regions that form the photodiode include a heavily doped P-type region that is arranged adjacent to an N-type region so as to form a fingered arrangement.

6. The semiconductor substrate of claim 1, wherein the photodiode is substantially vertical in orientation.

7. The semiconductor substrate of claim 1, wherein the photodiode is substantially lateral in orientation.

8. The semiconductor substrate of claim 1, wherein the light-transparent region in which light, from a light source, is able to reach a surface of the substrate, is located on a backside of the semiconductor wafer opposite to a side containing the doped regions.

9. The semiconductor substrate of claim 1, wherein the semiconductor substrate is illuminatable from underneath a surface of which the photodiode is provided to trigger the photodiode to induce current on the substrate.

10. A semiconductor substrate comprising:
a circuit formed on the substrate;
a light transparent region formed on the substrate; and
a photodiode integrally formed on a surface of the substrate that coincides with the light transparent region to power the circuit, the photodiode being formed by a combination of doped regions, including at least two oppositely-doped regions that will generate a photovoltaic potential with the application of light;
wherein the semiconductor substrate is of a silicon on insulator (SOI) type, and wherein the combination of doped regions that form the photodiode include a heavily doped P-type region that is arranged adjacent to an N-type region so as to form a fingered arrangement.

11. The semiconductor substrate of claim 10, wherein the combination of doped regions that form the photodiode include a heavily doped P-type region that is integrated into an N-well.

12. The semiconductor substrate of claim 11, wherein the heavily doped P-type region includes a shallow extension within the N-well.

13. The semiconductor substrate of claim 11, wherein the photodiode further comprises a heavily doped N-region formed within the N-well.

14. The semiconductor substrate of claim 13, wherein the photodiode is electrically isolated at the heavily doped N-region of the N-well.

15. The semiconductor substrate of claim 10, wherein the photodiode junction is substantially vertical in orientation.

16. The semiconductor substrate of claim 10, wherein the photodiode junction is substantially lateral in orientation.

17. The semiconductor substrate of claim 10, wherein the light-transparent region in which light, from a light source, is able to reach a surface of the substrate, is located on a backside of the semiconductor wafer opposite to a side containing the doped regions.

18. The semiconductor substrate of claim 10, wherein the semiconductor substrate is illuminatable from underneath a surface of which the photodiode is provided to trigger the photodiode to induce current on the substrate.

19. A semiconductor substrate comprising:
a circuit formed on the substrate;
a light transparent region formed on the substrate; and
a photodiode integrally formed on a surface of the substrate that coincides with the light transparent region to power the circuit, the photodiode being formed by a combination of doped regions, including at least two oppositely-doped regions that will generate a photovoltaic potential with the application of light;
wherein the light-transparent region in which light, from a light source, is able to reach a surface of the substrate, is located on the backside of the semiconductor wafer opposite to the side containing the doped regions.

20. The semiconductor substrate of claim 19, wherein the semiconductor substrate is illuminatable from underneath a surface of which the photodiode is provided to trigger the photodiode to induce current on the substrate.

21. The semiconductor substrate of claim 19, wherein the semiconductor substrate is of a silicon on insulator (SOI) type, and wherein the combination of doped regions that form the photodiode include a heavily doped P-type region that is arranged adjacent to an N-type region so as to form a fingered arrangement.

22. A semiconductor substrate comprising:
a circuit formed on the substrate;
a light transparent region formed on the substrate; and
a photodiode integrally formed on a surface of the substrate that coincides with the light transparent region to power the circuit, the photodiode being formed by a combination of doped regions, including at least two oppositely-doped regions that will generate a photovoltaic potential with application of light;
wherein the photodiode is substantially lateral in orientation.

23. The semiconductor substrate of claim 22, wherein the combination of doped regions that form the photodiode include a heavily doped P-type region that is integrated into an N-well.

24. The semiconductor substrate of claim 23, wherein the heavily doped P-type region includes a shallow extension within the N-well.

25. The semiconductor substrate of claim 23, wherein the photodiode further comprises a heavily doped N-region formed within the N-well.

26. The semiconductor substrate of claim 25, wherein the photodiode is electrically isolated at the heavily doped N-region of the N-well.

27. The semiconductor substrate of claim 22, wherein the semiconductor substrate is of a silicon on insulator (SOI) type, and wherein the combination of doped regions that form the photodiode include a heavily doped P-type region that is arranged adjacent to an N-type region so as to form a fingered arrangement.

28. The semiconductor substrate of claim 22, wherein the light-transparent region in which light, from a light source, is able to reach a surface of the substrate, is located on a backside of the semiconductor wafer opposite to a side containing the doped regions.

29. The semiconductor substrate of claim 22, wherein the semiconductor substrate is illuminatable from underneath a surface of which the photodiode is provided to trigger the photodiode to induce current on the substrate.

* * * * *